United States Patent
Chi

(10) Patent No.: US 12,374,249 B2
(45) Date of Patent: Jul. 29, 2025

(54) DISPLAY PANEL, PIXEL REPAIR METHOD AND DISPLAY DEVICE THEREOF

(71) Applicant: Hubei Yangtze Industrial Innovation Center of Advanced Display Co., LTD., Wuhan (CN)

(72) Inventor: Xiao Chi, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 0 days.

(21) Appl. No.: 18/622,655

(22) Filed: Mar. 29, 2024

(65) Prior Publication Data

US 2025/0218320 A1    Jul. 3, 2025

(30) Foreign Application Priority Data

Dec. 29, 2023 (CN) .......................... 202311868102.0

(51) Int. Cl.
| | |
|---|---|
| G09G 3/00 | (2006.01) |
| G09G 3/3233 | (2016.01) |
| H10K 59/12 | (2023.01) |
| H10K 59/131 | (2023.01) |
| H10K 71/00 | (2023.01) |

(52) U.S. Cl.
CPC ........... *G09G 3/006* (2013.01); *G09G 3/3233* (2013.01); *H10K 59/1201* (2023.02); *H10K 59/131* (2023.02); *H10K 71/861* (2023.02); G09G 2300/0413 (2013.01); G09G 2300/0426 (2013.01); G09G 2300/0842 (2013.01); G09G 2330/12 (2013.01)

(58) Field of Classification Search
CPC .... G09G 3/006; G09G 3/3233; G09G 3/3291; H10K 59/131; H10K 71/861
See application file for complete search history.

(56) References Cited

U.S. PATENT DOCUMENTS

| | | | |
|---|---|---|---|
| 2015/0102302 A1* | 4/2015 | Kim .................... | G09G 3/2003 438/4 |
| 2015/0102312 A1* | 4/2015 | Lee ........................ | H10K 59/88 257/40 |
| 2015/0138171 A1* | 5/2015 | Kim .................... | G09G 3/3233 345/82 |

(Continued)

*Primary Examiner* — Sardis F Azongha
(74) *Attorney, Agent, or Firm* — Anova Law Group, PLLC

(57) ABSTRACT

Display panel, pixel repair method, and display device are provided. The display panel includes a substrate and a display area. The display area includes a plurality of pixel driving circuit rows and a plurality of light-emitting elements. The pixel driving circuit row includes pixel driving circuits. The pixel driving circuit is electrically connected to at least one light-emitting element. The display panel also includes a plurality of repair driving circuits and a plurality of repair connection lines. The repair connection line extends along a first direction. Along a direction perpendicular to a plane of the substrate, the repair driving circuit at least partially overlaps with the repair connection line. The pixel driving circuit row is disposed with at least two repair connection lines. Along the direction perpendicular to the plane of the substrate, the pixel driving circuit row at least partially overlaps with the at least two repair connection lines.

29 Claims, 21 Drawing Sheets

(56) References Cited

U.S. PATENT DOCUMENTS

| | | | |
|---|---|---|---|
| 2016/0163243 A1* | 6/2016 | Park | G09G 3/3258 |
| | | | 345/87 |
| 2016/0189593 A1* | 6/2016 | Lee | G09G 3/3291 |
| | | | 438/4 |
| 2016/0335950 A1* | 11/2016 | Kang | G09G 3/2085 |
| 2016/0379535 A1* | 12/2016 | Park | G09G 3/006 |
| | | | 345/211 |
| 2017/0062544 A1* | 3/2017 | Kang | H10K 59/131 |
| 2020/0013992 A1* | 1/2020 | Cheng | H10K 59/80515 |
| 2022/0293695 A1* | 9/2022 | Jo | H10K 59/88 |
| 2023/0232683 A1* | 7/2023 | Kim | H10D 86/40 |
| | | | 257/40 |
| 2024/0138244 A1* | 4/2024 | Kim | H10K 59/88 |
| 2024/0224771 A1* | 7/2024 | Kim | H10K 59/1213 |

* cited by examiner

DISPLAY PANEL, PIXEL REPAIR METHOD AND DISPLAY DEVICE THEREOF

CROSS-REFERENCE TO RELATED APPLICATION

This application claims priority of Chinese Patent Application No. 202311868102.0, filed on Dec. 29, 2023, the entire content of which is hereby incorporated by reference.

FIELD OF THE DISCLOSURE

The present disclosure generally relates to the field of display technology and, more particularly, relates to a display panel, a pixel repair method thereof, and a display device thereof.

BACKGROUND

An Organic Light-emitting Diode (OLED) is a device that uses a multi-layer organic thin film structure to produce electroluminescence. An OLED may be easily made, and may only require a low driving voltage. Compared to conventional LCD display screens, OLED display screens may be thinner and lighter, and may have higher brightness, lower power consumption, faster response, higher definition, better flexibility and higher light-emitting efficiency, and may meet consumers' new needs for display technology. In an OLED display device, a pixel circuit needs to be set up in a display panel to drive the OLED device to emit light. When the pixel circuit is defective, the corresponding OLED device may not display correct brightness. As such, display defects may appear in the display panel, and display effects of the display panel may be affected.

SUMMARY

One aspect of the present disclosure includes a display panel. The display panel includes a substrate and a display area. The display area includes a plurality of pixel driving circuit rows and a plurality of light-emitting elements, a pixel driving circuit row of the plurality of pixel driving circuit rows includes a plurality of pixel driving circuits, and a pixel driving circuit of the plurality of pixel driving circuits is electrically connected to at least one light-emitting element of the plurality of light-emitting elements. The display panel also includes a plurality of repair driving circuits and a plurality of repair connection lines. A repair connection line of the plurality of repair connection lines extends along a first direction, and along a direction perpendicular to a plane of the substrate, a repair driving circuit of the plurality of repair driving circuits at least partially overlaps with the repair connection line. Along the first direction, the pixel driving circuit row is correspondingly disposed with at least two repair connection lines of the plurality of repair connection lines. Along the direction perpendicular to the plane of the substrate, the pixel driving circuit row at least partially overlaps with the at least two repair connection lines.

Another aspect of the present disclosure includes a pixel repair method for a display panel. The display panel includes a substrate and a display area. The display area includes a plurality of pixel driving circuit rows and a plurality of light-emitting elements, a pixel driving circuit row of the plurality of pixel driving circuit rows includes a plurality of pixel driving circuits, and a pixel driving circuit of the plurality of pixel driving circuits is electrically connected to at least one light-emitting element of the plurality of light-emitting elements. The display panel also includes a plurality of repair driving circuits and a plurality of repair connection lines. A repair connection line of the plurality of repair connection lines extends along a first direction, and along a direction perpendicular to a plane of the substrate, a repair driving circuit of the plurality of repair driving circuits at least partially overlaps with the repair connection line. Along the first direction, the pixel driving circuit row is correspondingly disposed with at least two repair connection lines of the plurality of repair connection lines. Along the direction perpendicular to the plane of the substrate, the pixel driving circuit row at least partially overlaps with the at least two repair connection lines. The method includes determining a defective pixel, disconnecting electrical connection between the light-emitting element of the defective pixel and the pixel driving circuit, and electrically connecting the light-emitting element of the defective pixel to a repair connection line corresponding to the defective pixel.

Another aspect of the present disclosure includes a display device. The display device includes a display panel. The display panel includes a substrate and a display area. The display area includes a plurality of pixel driving circuit rows and a plurality of light-emitting elements, a pixel driving circuit row of the plurality of pixel driving circuit rows includes a plurality of pixel driving circuits, and a pixel driving circuit of the plurality of pixel driving circuits is electrically connected to at least one light-emitting element of the plurality of light-emitting elements. The display panel also includes a plurality of repair driving circuits and a plurality of repair connection lines. A repair connection line of the plurality of repair connection lines extends along a first direction, and along a direction perpendicular to a plane of the substrate, a repair driving circuit of the plurality of repair driving circuits at least partially overlaps with the repair connection line. Along the first direction, the pixel driving circuit row is correspondingly disposed with at least two repair connection lines of the plurality of repair connection lines. Along the direction perpendicular to the plane of the substrate, the pixel driving circuit row at least partially overlaps with the at least two repair connection lines.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
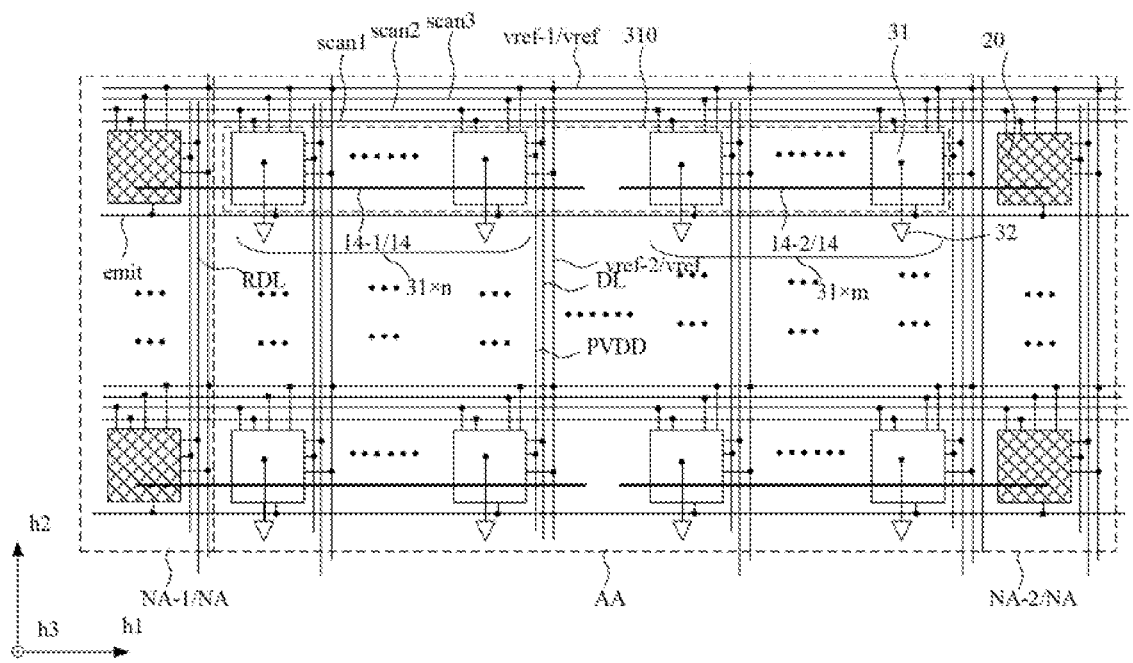
FIG. 1 illustrates a partial schematic diagram of a display panel consistent with the disclosed embodiments of the present disclosure.

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Technologies, methods, and equipment known to those of ordinary skill in relevant fields may not be discussed in detail, but where appropriate, these technologies, methods, and equipment should be regarded as part of the specification.

Reference will now be made in detail to embodiments of the present disclosure, which are illustrated in the accompanying drawings. Similar labels and letters designate similar items in the drawings. Once an item is defined in one drawing, the item may not be defined and discussed in subsequent drawings.

The present disclosure provides a display panel, including a substrate and a display area. FIG. 1 illustrates a partial schematic diagram of a display panel consistent with the disclosed embodiments of the present disclosure. Referring to FIG. 1, the display area AA includes a plurality of pixel driving circuit rows 310 and a plurality of light-emitting elements 32. The pixel driving circuit row 310 includes a plurality of pixel driving circuits 31 arranged along a first direction h1. One pixel driving circuit 31 is electrically connected to at least one light-emitting element 32. Specifically, as shown in FIG. 1, the display panel also includes a plurality of signal lines. The plurality of signal lines includes a first scan line scan1, a second scan line scan2, a third scan line scan3, a lateral reset voltage line vref-1, a vertical reset voltage line vref-2, an emission control line emit, a pixel data line DL and a power supply voltage line PVDD. Each pixel driving circuit 31 is connected to the first scan line scan1, the second scan line scan2, the third scan line scan3, the lateral reset voltage line vref-1, the light emission control line emit, the pixel data line DL, and the power supply voltage line PVDD, and drive the corresponding light-emitting element 32 to emit light.

The display panel also includes a repair driving circuit 20. As shown in FIG. 1, the pixel driving circuit 31 and the repair driving circuit 20 are each connected to the vertical reset voltage line vref-2. The vertical reset voltage line vref-2 and the lateral reset voltage line vref-1 are electrically connected to form a grid design, reducing the loading difference of each pixel in the display panel. As such, in an actual display panel, it is not required that each pixel driving circuit 31 or repair driving circuit 20 needs to be directly connected to the vertical reset voltage line vref-2. FIG. 1 is only exemplarily. In following embodiments, the connection relationship between the repair driving circuit 20 and the vertical reset voltage line vref-2 is similar to the connection relationship shown in FIG. 1, and will not be elaborated.

It should be noted that in an actual display panel, the pixel driving circuit 31 may be used to implement a variety of driving methods. As such, a plurality of settings for the quantity and type of signal lines is required, for example, setting only two scan lines. Accordingly, one pixel driving circuit row 310 may correspond to other signal line settings. FIG. 1 is only an example, and does not limit specific signal line settings in an actual display panel.

The display panel also includes a repair driving circuit 20 and a repair connection line 14. The repair connection line 14 extends along the first direction h1. In a direction h3 perpendicular to a plane of the substrate, the repair driving circuit 20 at least partially overlaps with the repair connection line 14. The display panel also includes a repair data line RDL. Each repair driving circuit 20 is connected to the first scan line scan1, the second scan line scan2, the third scan line scan3, the lateral reset voltage line vref-1, the light-emitting control line emit, the repair data line RDL, and the power voltage line PVDD. When used for repair, each repair driving circuit 20 may drive the corresponding light-emitting element 32 to emit light. Specifically, as shown in FIG. 1, the repair driving circuit 20 and the pixel driving circuit 31 in a same pixel driving circuit row are connected to a same first scanning line scan1, a same second scanning line scan2, a same third scanning line scan3, a same lateral reset voltage line vref-1 and a same light-emitting control line emit. As such, the repair driving circuit 20 may directly use a scanning signal, a reset signal, and a control signal of a defective pixel to drive a light-emitting element 32 corresponding to the defective pixel to emit light. For example, under a same grayscale voltage, a defective pixel may appear brighter (a bright spot) or darker (a dark spot) than other normal pixels. In other words, the defective pixel may not be lit directly (dead pixel).

Along the first direction h1, the pixel driving circuit row 310 is provided with at least two repair connection lines 14 correspondingly. That is, in a direction perpendicular to the plane of the substrate, one pixel driving circuit row 310 overlaps with at least two repair connection lines 14. Taking FIG. 1 as an example, one pixel driving circuit row 310 is correspondingly provided with a repair connection line 14-1 and a repair connection line 14-2. In some other embodiments, one pixel driving circuit row 310 may be provided with three or more repair connection lines 14 correspondingly. It should be noted that, for subsequent repair of a defective pixel appearing in the display area of the display panel, it is preferable to make the repair connection line 14 at least partially overlap with the connection structure between the pixel driving circuit 31 and the light-emitting element 32, in the thickness direction of the display panel. The connection structure between the pixel driving circuit 31 and the light-emitting element 32 may be a switching structure electrically connected to each of transistors in the pixel driving circuit 31 and the light-emitting element 32.

Figure 2:
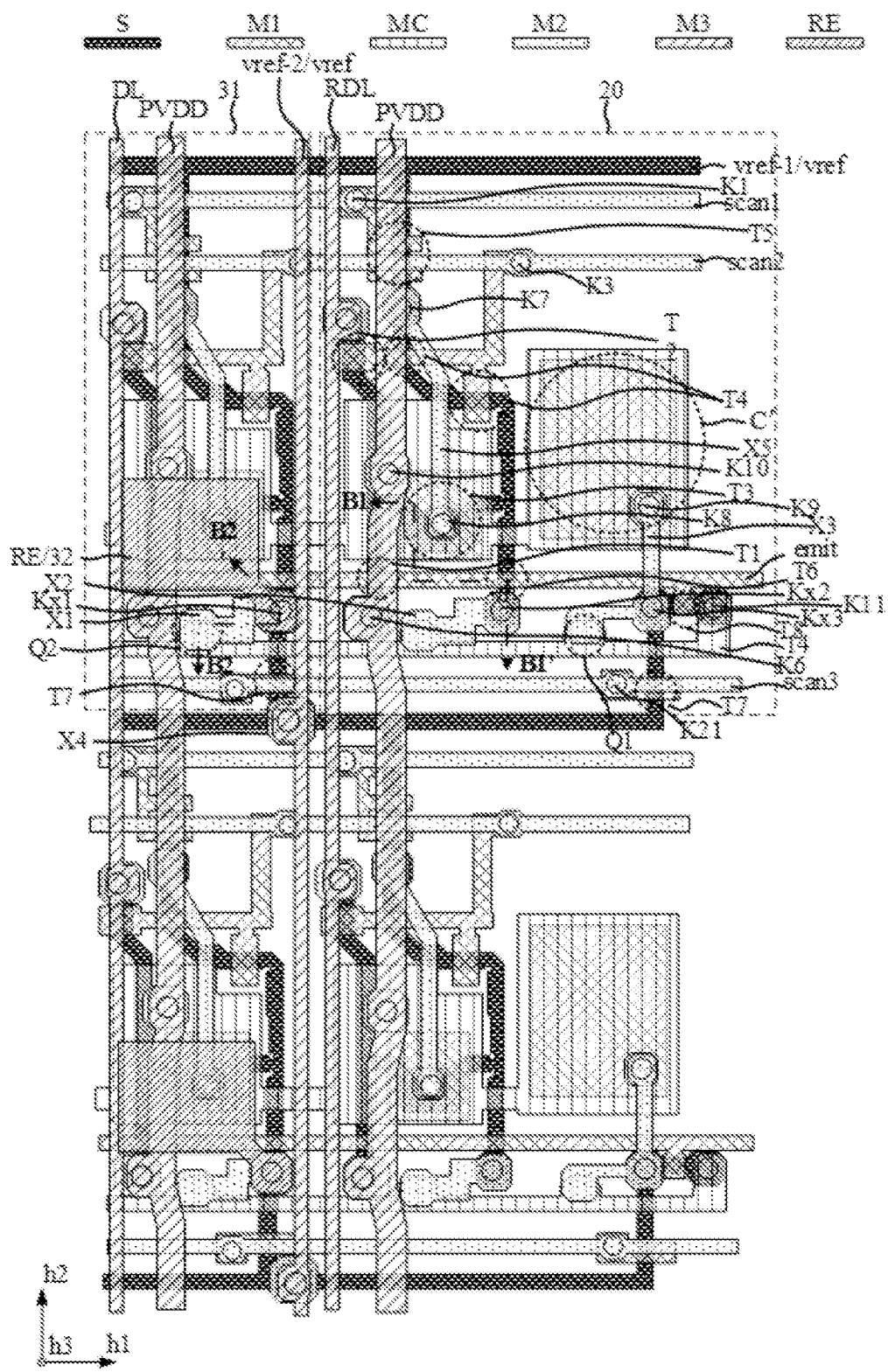
FIG. 2 illustrates a partial wiring diagram of a display panel consistent with the disclosed embodiments of the present disclosure.
Figure 3:
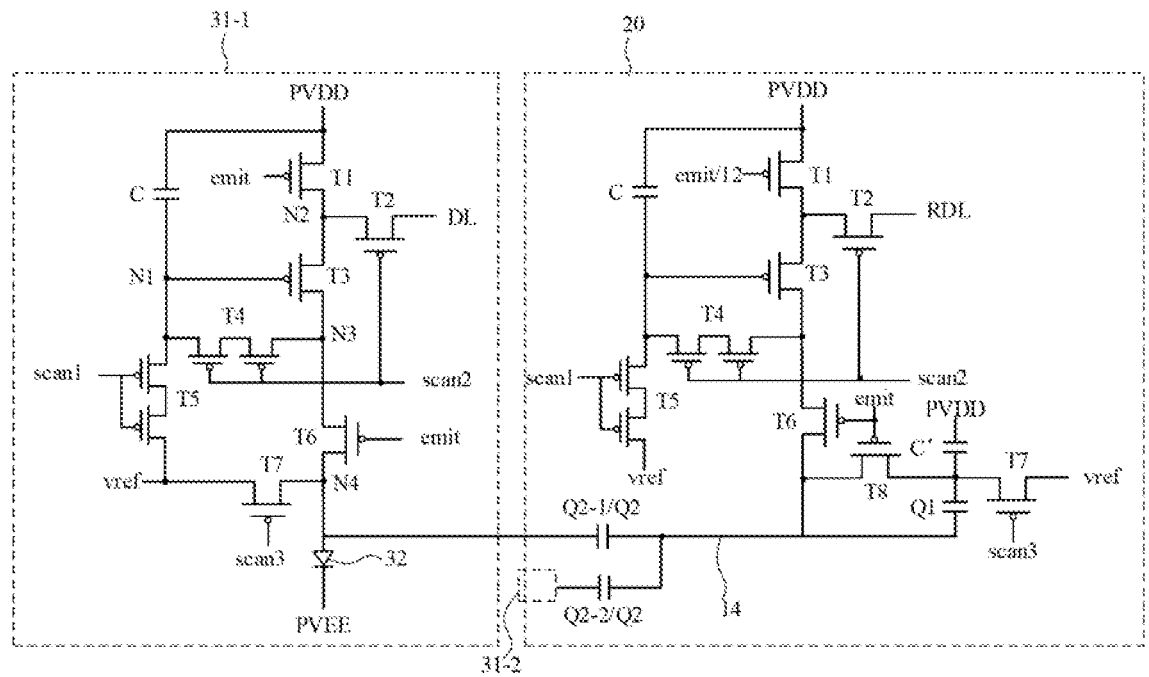
FIG. 3 illustrates a schematic circuit diagram of a display panel consistent with the disclosed embodiments of the present disclosure.
Figure 4:
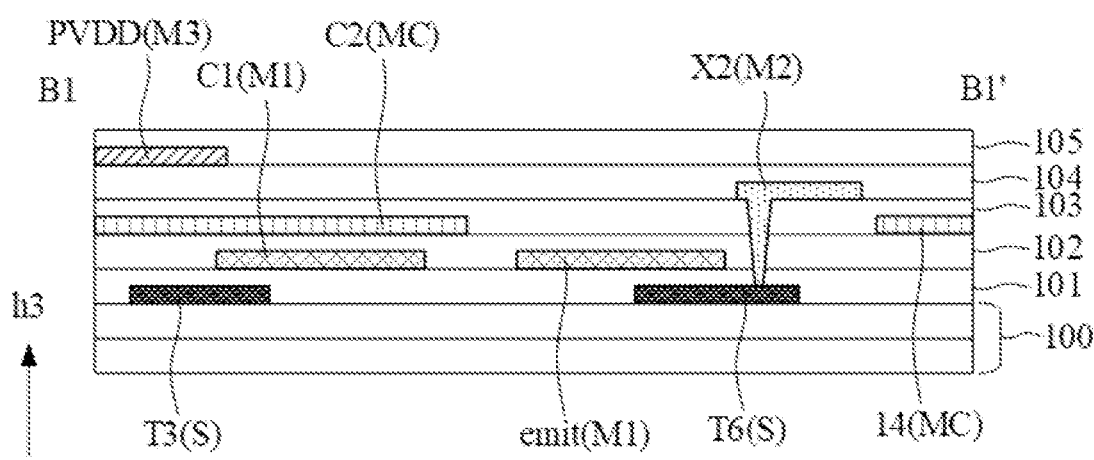
FIG. 4 illustrates a partial cross-sectional schematic diagram of a display panel consistent with the disclosed embodiments of the present disclosure.

Specifically, when operating normally, the pixel driving circuit 31 only overlaps with the corresponding repair connection line 14-1 in the direction h3 perpendicular to the plane of the substrate. The pixel driving circuit 31 and the corresponding repair connection line 14-1 are not directly electrically connected. FIG. 2 illustrates a partial wiring diagram of a display panel consistent with the disclosed embodiments of the present disclosure. FIG. 3 illustrates a schematic circuit diagram corresponding to the layout structure of FIG. 2, and FIG. 4 illustrates a cross-sectional structure of the partial display panel cut along B1-B1' in FIG. 2. As shown in FIGS. 2-4, the pixel driving circuit 31 and the repair driving circuit 20 each include transistors T1 to T7 and a first storage capacitor C. The repair driving circuit 20 additionally includes a transistor T8 and a second storage capacitor C'. The display panel includes a substrate 100 and a driving circuit layer. The pixel driving circuit and the repair driving circuit are each disposed on the driving circuit layer, and the light-emitting element is disposed on a side of the driving circuit layer away from the substrate 100. The driving circuit layer specifically includes an active layer S, a first insulating layer 101, a first metal layer M1, a second insulating layer 102, a capacitor metal layer MC, a third insulating layer 103, a second metal layer M2, a fourth insulating layer 104, a third metal layer M3 and a fifth insulating layer 105 stacked in sequence. The first metal layer M1, the capacitor metal layer MC, the second metal layer M2, and the third metal layer M3 may be collectively referred to as wiring metal layers, used for laying out signal lines or transfer structures. The active layer S is disposed on one side of the substrate 100. The first insulating layer 101 is disposed on a side of the active layer S away from the substrate 100. The first metal layer M1 is disposed on a side of the first insulating layer 101 away from the active layer S. The second insulating layer 102 is disposed on a side of the first metal layer M1 away from the active layer S. The capacitor metal layer MC is disposed on a side of the second insulating layer 102 away from the first metal layer M1. The third insulating layer 103 is disposed on a side of the capacitive metal layer MC away from the second insulating layer 102. The second metal layer M2 is disposed on a side of the third insulating layer 103 away from the capacitive metal layer MC. The fourth insulating layer 104 is disposed on a side of the second metal layer M2 away from the third insulating layer 103. The third metal layer M3 is disposed on a side of the fourth insulating layer 104 away from the second metal layer M2. The fifth insulating layer 105 is disposed on a side of the third metal layer M3 away from the fourth insulating layer 104.

Figure 5:
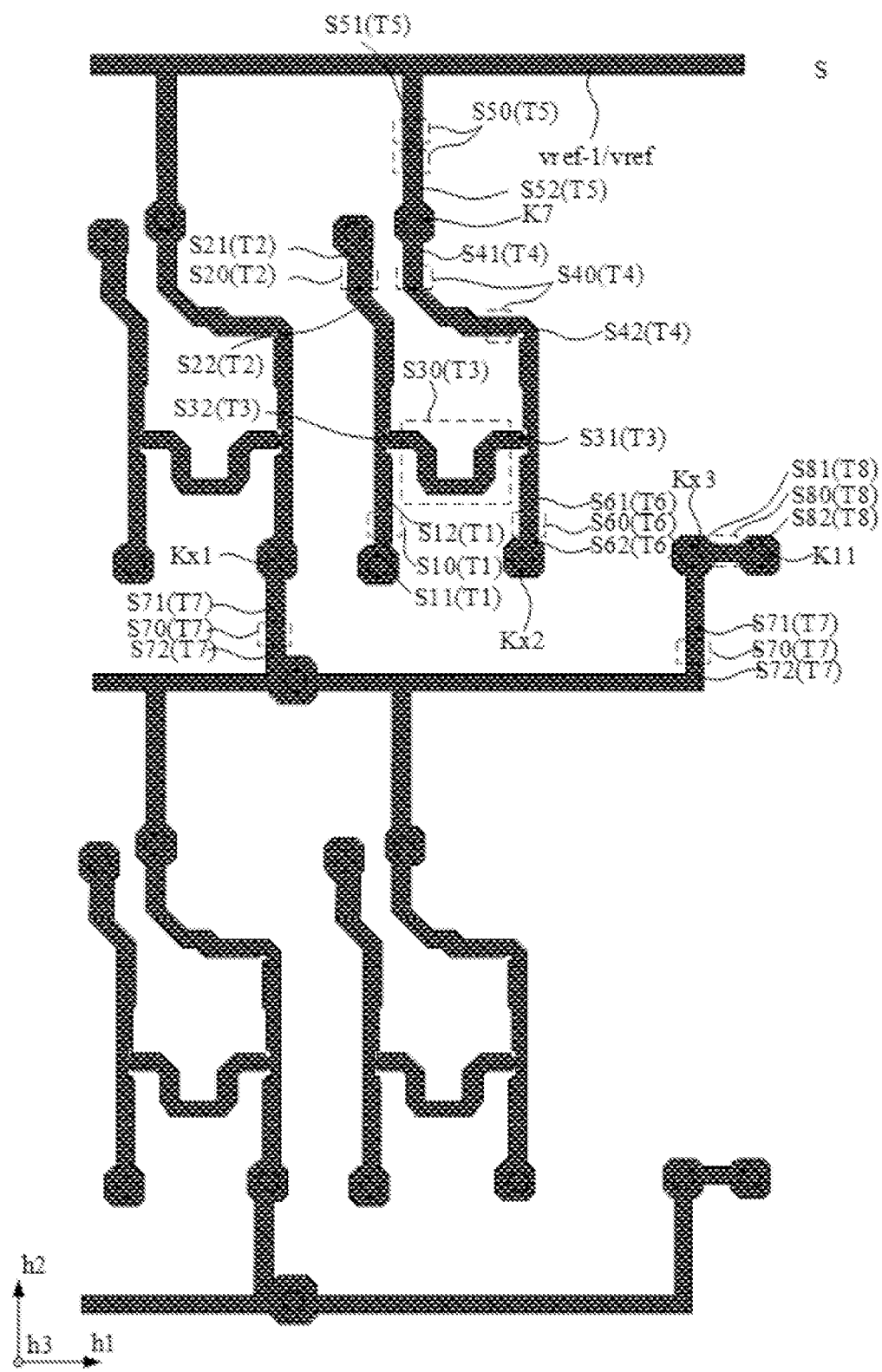
FIG. 5 illustrates a schematic structural diagram of an active layer of a display panel consistent with the disclosed embodiments of the present disclosure.

FIG. 5 illustrates a schematic structural diagram of an active layer of a display panel. Referring to FIGS. 2, 4 and 5, the active layer S includes a first channel region S10, a first doped region S11 and a second doped region S12 disposed on two sides of the first channel region S10, a second channel region S20, a third doped region S21 and a fourth doped region S22 disposed on two sides of the second channel region S20, a third channel region S30, a third doped region S21 disposed on two sides of the third channel region S30, a fifth doped region S31 and a sixth doped region S32, two fourth channel regions S40, a seventh doping region S41 and an eighth doping region S42 disposed on two sides of the two fourth channel regions S40 (as well as a doping area between the two fourth channel regions S40), two fifth channel regions S50, a ninth doping region S51 and a tenth doping region S52 disposed on two sides of the two fifth channel regions S50 (as well as a doping area between the two fifth channel regions S50), a sixth channel region S60, a eleventh doping region S61 and a twelfth doping region S62 disposed on two sides of the sixth channel region S60, a seventh channel region S70, a thirteenth doping region S71 and a fourteenth doping region S72 disposed on two sides of the seventh channel region S70, an eighth channel region S80, a fifteenth doping region S81 and a sixteenth doping region S82 disposed on two sides of the ninth channel region S80. One of the two doped regions disposed on two sides of each channel region is a source region, and the other of the two doped regions is a drain region. The source region and drain region are doped with impurities. The impurities include P-type impurities or N-type impurities. Exemplarily, the active layer S includes low-temperature polysilicon, amorphous silicon, oxide active layers, or a combination thereof.

As shown in FIGS. 2 and 5, the active layer S also includes a lateral reset voltage line vref–1. For example, the lateral reset voltage line vref–1 is connected to the ninth doping region S51 and the fourteenth doping region S72 respectively. Such a setting is equivalent to setting the lateral reset voltage line vref–1 on the active layer S, and may not occupy a space of the wiring metal layer on a side of the active layer S away from the substrate. Accordingly, the wiring metal layer over the substrate may have enough space for laying other signal lines or structures.

Figure 6:
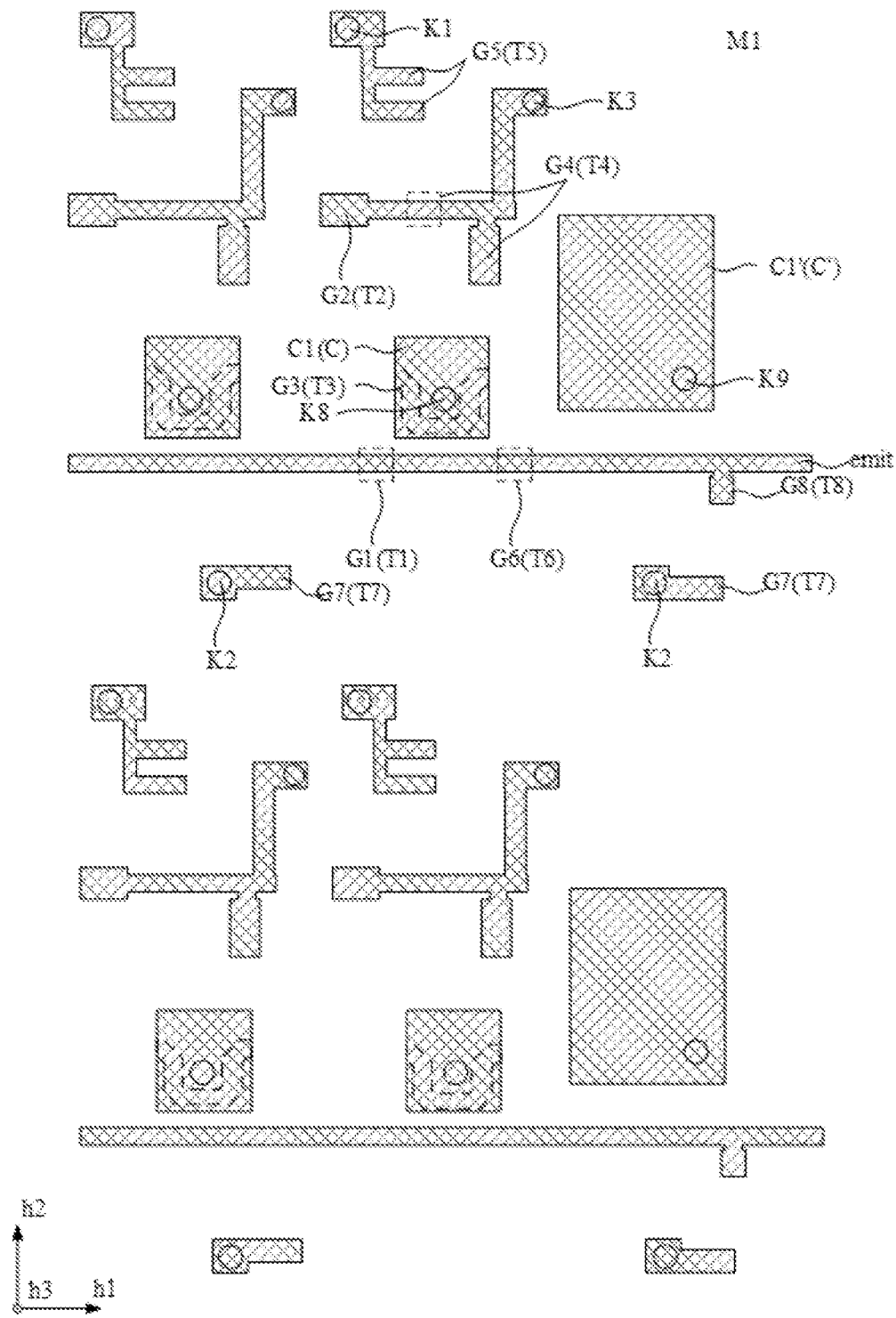
FIG. 6 illustrates a schematic structural diagram of a first metal layer of a display panel consistent with the disclosed embodiments of the present disclosure.

FIG. 6 illustrates a schematic structural diagram of a first metal layer of a display panel. Referring to FIGS. 2 and 6, the first metal layer M1 includes the light-emitting control line emit, a first plate C1 of the first storage capacitor C, a first plate C1' of the second storage capacitor C', a gate G2 of the data writing transistor T2, a gate G4 of the threshold compensation transistor T4, a gate G5 of the first reset transistor T5, and a gate G7 of the second reset transistor T7. The gate G2 of the data writing transistor T2 and the gate G4 of the threshold compensation transistor T4 may be electrically connected.

Referring to FIGS. 5 and 6, along the thickness direction h3 of the display panel, the gate G2 of the data writing transistor T2 overlaps with the second channel region S20. The gate G4 of the threshold compensation transistor T4 overlaps with the fourth channel region S40. The gate G5 of the first reset transistor T5 overlaps the fifth channel region S50. The gate G7 of the second reset transistor T7 overlaps with the seventh channel region S70. The overlapping portions of the light-emitting control line emit with the first channel region S10, sixth channel region S60, and eighth channel region S80 respectively form the gate G1 of the first light-emitting control transistor T1, the gate G6 of the second light-emitting control transistor T6, and the gate G8 of the repair control transistor T8. The overlapping portion of the first plate C1 of the first storage capacitor C with the third channel region S30 corresponds to the gate G3 of the driving transistor T3.

Figure 7:
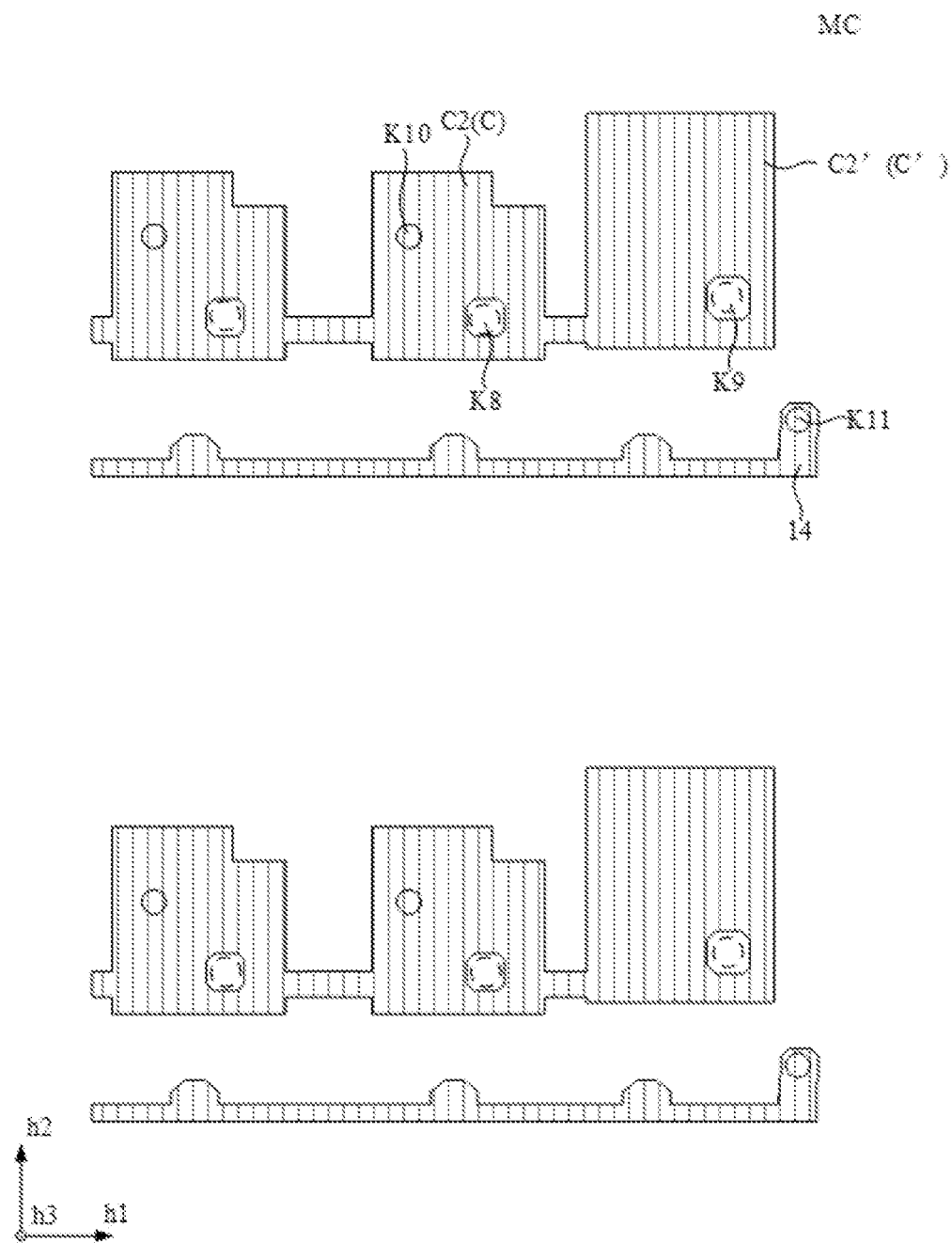
FIG. 7 illustrates a schematic diagram of a capacitive metal layer structure of a display panel consistent with the disclosed embodiments of the present disclosure.

FIG. 7 illustrates a schematic diagram of a capacitive metal layer structure of a display panel. Referring to FIGS. 2 and 7, the capacitor metal layer MC includes a second plate C2 of the first storage capacitor C, a second plate C2' of the second storage capacitor C', and the repair connection line 14.

Figure 8:
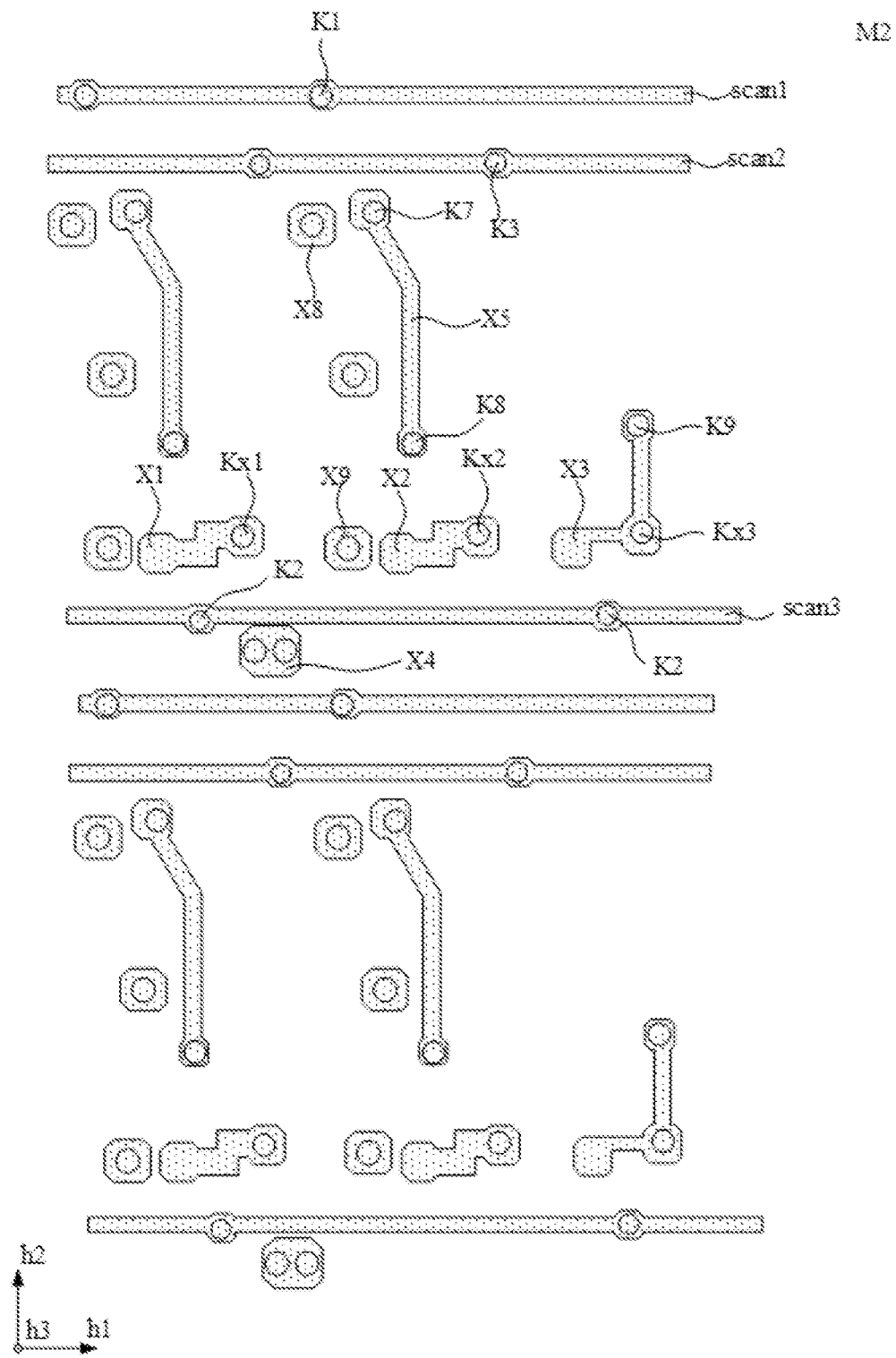
FIG. 8 illustrates a schematic structural diagram of a second metal layer of a display panel consistent with the disclosed embodiments of the present disclosure.

FIG. 8 illustrates a schematic structural diagram of a second metal layer of a display panel. Referring to FIGS. 2 and 8, the second metal layer M2 includes the first scan line scan1, the second scan line scan2, the third scan line scan3, a first transfer structure X1, a second transfer structure X2, a third transfer structure X3, and a fourth transfer structure X4, a fifth switching structure X5, an eighth switching structure X8 and a ninth switching structure X9.

Referring to FIGS. 2, 5 and 8, the first scan line scan1 is electrically connected to the gate G5 of the first reset transistor T5 disposed in the first metal layer M1 through a first via K1. The second scan line scan2 is electrically connected to the gate G4 of the threshold compensation transistor T4 and the gate G2 of the data writing transistor T2 disposed in the first metal layer M1 through a third via K3. The third scan line scan3 is electrically connected to the gate G7 of the second reset transistor T7 disposed in the first metal layer M1 through the second via K2.

Figure 9:
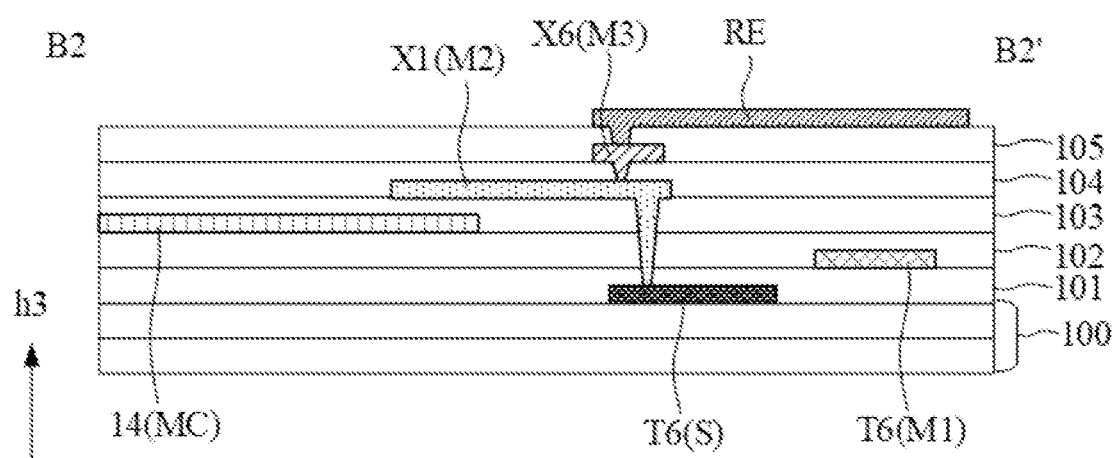
FIG. 9 illustrates a partial cross-sectional schematic diagram of another display panel consistent with the disclosed embodiments of the present disclosure.

Referring to FIGS. 2, 5, 7 and 8, the first transfer structure X1 is electrically connected to a twelfth doping region S62 of the second light-emitting control transistor T6 of the pixel driving circuit disposed on the active layer S, through a first transfer via Kx1. FIG. 9 illustrates a partial cross-sectional schematic diagram of the display panel cut along B2-B2' in FIG. 2. As shown in FIG. 9, the first transfer structure X1 also at least partially overlaps with the repair connection line 14 disposed on the capacitor metal layer MC in the direction h3 perpendicular to the plane of the substrate, forming a second parasitic capacitance Q2.

Referring to FIGS. 2, 5, 7 and 8, the second transfer structure X2 is electrically connected to the twelfth doping region S62 of the second light-emitting control transistor T6 of the repair driving circuit disposed on the active layer S through the second transfer via Kx2. In addition, the second transfer structure X2 at least partially overlaps with the repair connection line 14 disposed on the capacitor metal layer MC, in the direction h3 perpendicular to the plane of the substrate. Optionally, the second transfer structure X2 may be electrically connected to the repair connection line 14 disposed on the capacitor metal layer MC through a via.

Referring to FIGS. 2, 5, 7 and 8, the third transfer structure X3 is electrically connected to the fifteenth doping region S81 of the repair control transistor T8 of the repair driving circuit disposed on the active layer S through a third transfer via Kx3. The third transfer structure X3 at least partially overlaps with the repair connection line 14 disposed on the capacitor metal layer MC in the direction h3 perpendicular to the plane of the substrate.

Referring to FIGS. 2, 6 and 8, the third transfer structure X3 is electrically connected to the first plate C1' of the second storage capacitor C' of the repair driving circuit disposed on the first metal layer M1 through a ninth via K9.

Referring to FIGS. 2, 5, 6 and 8, the fifth transfer structure X5 is electrically connected to the tenth doped region S52 of the first reset transistor T5 and the seventh doped region S41 of the threshold compensation transistor T4 disposed on the active layer S through a seventh via K7. The fifth transfer structure X5 is also electrically connected to the first plate C1 of the first storage capacitor C disposed on the first metal layer M1 through an eighth via K8.

Figure 10:
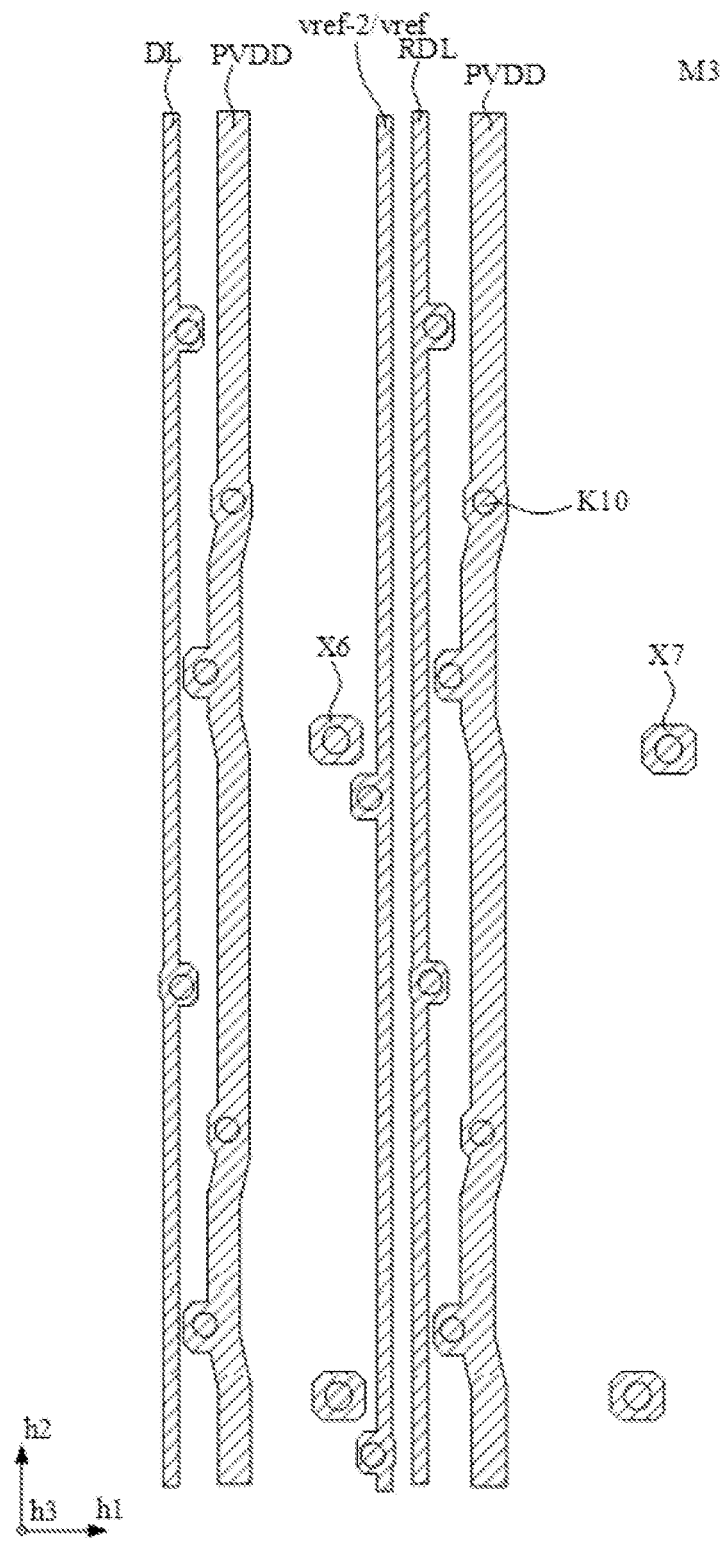
FIG. 10 illustrates a schematic structural diagram of a third metal layer of the display panel consistent with the disclosed embodiments of the present disclosure.

FIG. 10 illustrates a schematic structural diagram of a third metal layer of the display panel. Referring to FIGS. 2 and 10, the third metal layer M3 includes the pixel data line DL, the repair data line RDL, the vertical reset voltage line vref–2, the power supply voltage line PVDD, a sixth transfer structure X6 and a seventh transfer structure X7. The vertical reset voltage line vref–2 is electrically connected to the lateral reset voltage line vref–1.

Referring to FIGS. 2, 9 and 10, the display panel also includes an anode metal layer RE. The anode metal layer RE is disposed on a side of the driving circuit layer away from the substrate 100. The anode of the light-emitting element is disposed on the anode metal layer RE. The anode of the light-emitting element is electrically connected to the active layer S through the sixth transfer structure X6 and the first transfer structure X1, thereby avoiding the anode metal layer RE from being directly electrically connected to the active layer S through a deeper via. That is, by using the second metal layer M2 and the third metal layer M3 as transfer structures, and flexibly setting corresponding vias, display areas of the pixels may not be occupied. Accordingly, the aperture ratio may be increased, and display brightness may be improved. It should be noted that the seventh transfer structure X7 may be electrically connected to the second transfer structure X2. By disposing the seventh transfer structure, etching effects at the edge position and the middle position in the display area AA may be consistent, and the display uniformity of the display panel may be improved. It may be understood that, in some other embodiments, the display panel may not include the seventh transfer structure X7.

Referring to FIGS. 2, 5, 8 and 10, the lateral reset voltage line vref-1 disposed on the active layer S is electrically connected to the fourth transfer structure X4 through a via. The fourth transfer structure X4 is electrically connected to the vertical reset voltage line vref-2 disposed on the third metal layer M3 through a via. As such, the lateral reset voltage line vref-1 disposed on the active layer S may be electrically connected to the vertical reset voltage line vref-2 disposed in the third metal layer M3 through the fourth transfer structure X4. That is, a grid design of the reset voltage lines may be realized.

Referring to FIGS. 2, 5, 8 and 10, the pixel data line DL is electrically connected to the eighth transfer structure X8 disposed on the second metal layer M2 through a via. The eighth transfer structure X8 is electrically connected to the third doping region S21 of the data writing transistor T2 of the pixel driving circuit disposed on the active layer S through a via. Then, the pixel data line DL disposed on the third metal layer M3 may be electrically connected to the data writing transistor T2 of the pixel driving circuit disposed on the active layer S through the eighth transfer structure X8. As such, the data voltage may be transmitted to the source or drain of the data writing transistor T2. The repair data line RDL is electrically connected to the eighth transfer structure X8 disposed on the second metal layer M2 through a via. The eighth transfer structure X8 is electrically connected to the third doping region S21 of the data writing transistor T2 of the repair driving circuit disposed on the active layer S through a via. Then, the repair data line RDL disposed in the third metal layer M3 may be electrically connected to the data writing transistor T2 of the pixel driving circuit disposed on the active layer S through the eighth transfer structure X8. As such, the data voltage may be transmitted to the source or drain of the data writing transistor T2.

Referring to FIGS. 2, 5, 8 and 10, the power supply voltage line PVDD is electrically connected to the ninth transfer structure X9 disposed on the second metal layer M2 through a via. The ninth transfer structure X9 is electrically connected to the first doping region S11 of the first light-emitting control transistor T1 disposed on the active layer S through a via. Then, the power supply voltage line PVDD disposed in the third metal layer M3 may be electrically connected to the first light-emitting control transistor T1 disposed on the active layer S through the ninth transfer structure X9. Accordingly, the power supply voltage may be transmitted to the source or drain of the first light-emitting control transistor T1. It may be understood that to electrically connect the power supply voltage line PVDD disposed on the third metal layer M3 and the second plate C2 disposed on the capacitor metal layer MC, the second metal layer M2 may also be used for transfer. Details will not be elaborated here.

Referring to FIGS. 2, 7 and 10, the power supply voltage line PVDD is electrically connected to the second plate C2 of the first storage capacitor C and the second plate C2' of the second storage capacitor C' disposed on the capacitor metal layer MC through a tenth via K10, to transmit the power supply voltage to the first storage capacitor C and the second storage capacitor.

As shown in FIGS. 2 and 3, the pixel driving circuit 31 includes a driving transistor T3, a data writing transistor T2, a first reset transistor T5, a second reset transistor T7, a threshold compensation transistor T4, a first light-emitting control transistor T1, a second light-emitting control transistor T6 and a first storage capacitor C. A first electrode of the first light-emitting control transistor T1 is electrically connected to the power supply voltage line PVDD. A second electrode of the first light-emitting control transistor T1 is electrically connected to a first electrode of the driving transistor T3. A gate of the first light-emitting control crystal is electrically connected to the light-emitting control line emit. A first electrode of the first reset transistor T5 is electrically connected to the reset voltage line vref. A second electrode of the first reset transistor T5 is electrically connected to a gate of the driving transistor T3. A gate of the first reset transistor T5 is electrically connected to the first scan line scan1. A first electrode of the threshold compensation transistor T4 is electrically connected to a second electrode of the driving transistor T3. A second electrode of the threshold compensation transistor T4 is electrically connected to the gate of the driving transistor T3. A gate of the threshold compensation transistor T4 is electrically connected to the second scan line scan2. A first electrode of the data writing transistor T2 is electrically connected to the pixel data line DL. A second electrode of the data writing transistor T2 is electrically connected to the first electrode of the driving transistor T3. A gate of the data writing transistor T2 is electrically connected to the second scanning line scan2. A second plate of the first storage capacitor C is electrically connected to the power supply voltage line PVDD. A first plate of the first storage capacitor C is electrically connected to the gate of the driving transistor T3. A first electrode of the second light-emitting control transistor T6 is electrically connected to the second electrode of the driving transistor T3. A gate of the second light-emitting control transistor T6 is electrically connected to the light-emitting control line emit. A second electrode of the second light-emitting control transistor T6 is electrically connected to an anode of the light-emitting element 32. A first electrode of the second reset transistor T7 is electrically connected to the reset voltage line vref. A gate of the second reset transistor T7 is electrically connected to the third scan line scan3. A second electrode of the second reset transistor T7 is electrically connected to the anode of the light-emitting element 32.

Figure 11:
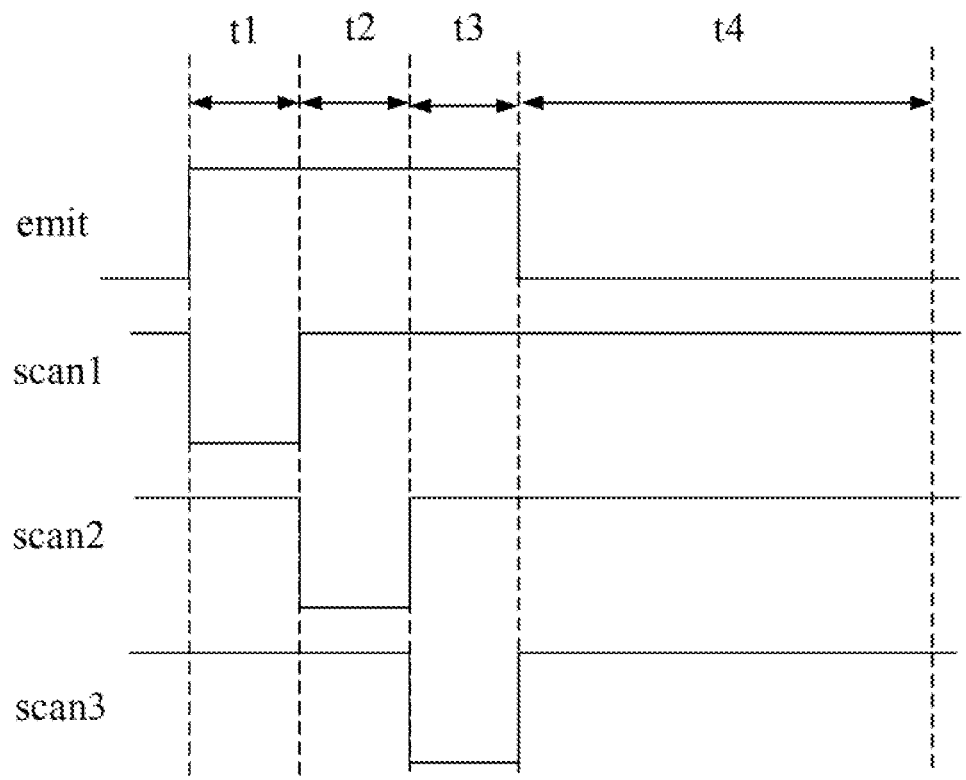
FIG. 11 illustrates a schematic operation timing diagram of a pixel driving circuit consistent with the disclosed embodiments of the present disclosure.

FIG. 11 illustrates a schematic operation timing diagram of a pixel driving circuit. Referring to FIGS. 2, 3 and 11, an operation process of the pixel driving circuit includes a first reset phase t1, a charging phase t2, a second reset phase t3, and a light-emitting phase t4.

In the first reset phase t1, the first scan line scan1 controls the first reset transistor T5 to turn on, and the reference voltage provided by the reset voltage line vref may reset the first node N1 through the first reset transistor T5. In the charging phase t2, the second scan line scan2 controls the data writing transistor T2 and the threshold compensation transistor T4 to turn on, and the data voltage Vdata provided by the pixel data line DL may be written into the second node N2 through the data writing transistor T2. In the charging phase t2, the driving transistor T3 is turned on. A potential of the first node N1 may continuously change until the potential VN1 of the first node N1 changes to VN1=Vdata−|Vth|, where Vdata is a data voltage provided by the pixel data line DL, and Vth is a threshold voltage of the driving transistor T3. In the second reset phase t2, the third scan line scan3 controls the second reset transistor T7 to turn on. The reference voltage provided by the reset voltage line vref resets the fourth node N4 through the second reset transistor T7. In the light-emitting phase t4, the first light-emitting control transistor T1, the second light-emitting control transistor T6 and the driving transistor T3 are turned on. Under the action of the first power supply voltage provided by the power supply voltage line PVDD and the second power supply voltage provided by the second power supply voltage line PVEE, the current path between the power supply voltage line PVDD and the second power supply voltage line PVEE is turned on. Accordingly, the light-emitting element 32 electrically connected to the pixel driving circuit 31 may light up.

Figure 12:
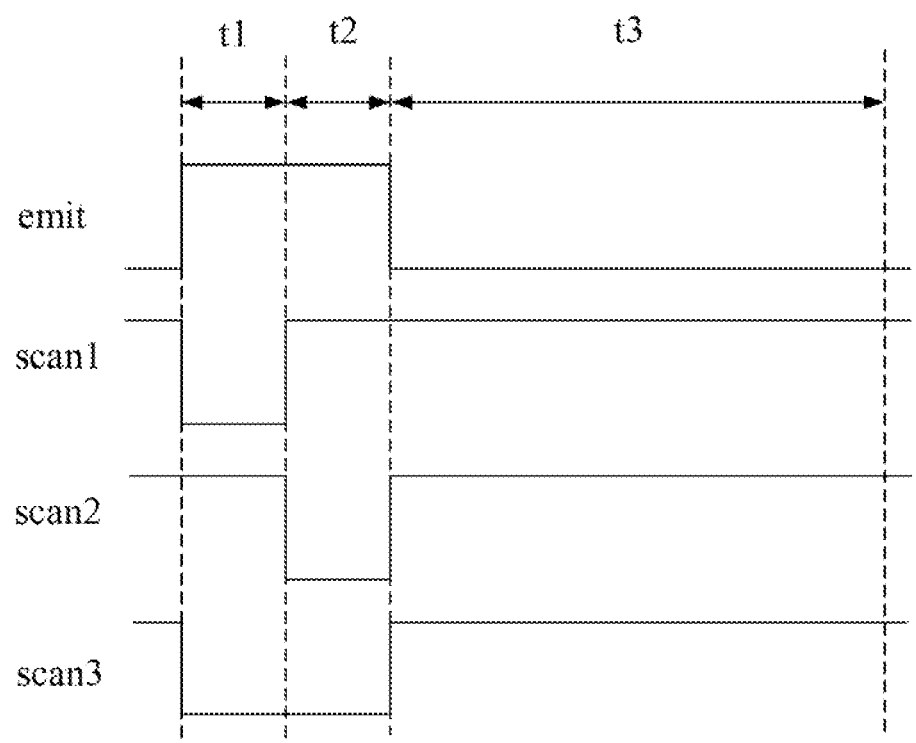
FIG. 12 illustrates a schematic operation timing diagram of another pixel driving circuit consistent with the disclosed embodiments of the present disclosure.

FIG. 12 illustrates a schematic operation timing diagram of another pixel driving circuit. In another embodiment, referring to FIGS. 2, 3 and 12, when the pixel driving circuit 31 is in operation, the operation process of the pixel driving circuit includes a reset phase t1, a charging phase t2 and a light-emitting phase t3.

In the reset phase t1, the first scan line scan1 and the third scan line scan3 control the first reset transistor T5 and the second reset transistor T7 to turn on. The reference voltage provided by the reset voltage line vref resets the first node N1 and the fourth node N4 through the first reset transistor T5 and the second reset transistor T7. In the charging phase t2, the second scan line scan2 controls the data writing transistor T2 and the threshold compensation transistor T4 to turn on. The data voltage Vdata provided by the pixel data line DL is written into the second node N2 through the data writing transistor T2. In the charging phase t2, the driving transistor T3 is turned on. The potential of the first node N1 may continuously change until the potential VN1 of the first node N1 changes to VN1=Vdata−|Vth, where Vdata is the data voltage provided by the pixel data line DL, and Vth is the threshold voltage of the driving transistor T3. Simultaneously, in the charging phase t2, the third scan line scan3 controls the second reset transistor T7 to turn on. The reference voltage provided by the lateral reset voltage line vref−1 resets the fourth node N4 through the second reset transistor T7. In the light-emitting phase t3, the first light-emitting control transistor T1, the second light-emitting control transistor T6 and the driving transistor T3 are turned on. Under the action of the first power supply voltage provided by the power supply voltage line PVDD and the second power supply voltage provided by the second power supply voltage line PVEE, the current path between the power supply voltage line PVDD and the second power supply voltage line PVEE is turned on. The light-emitting element 32 electrically connected to the pixel driving circuit 31 may light up.

Figure 13:
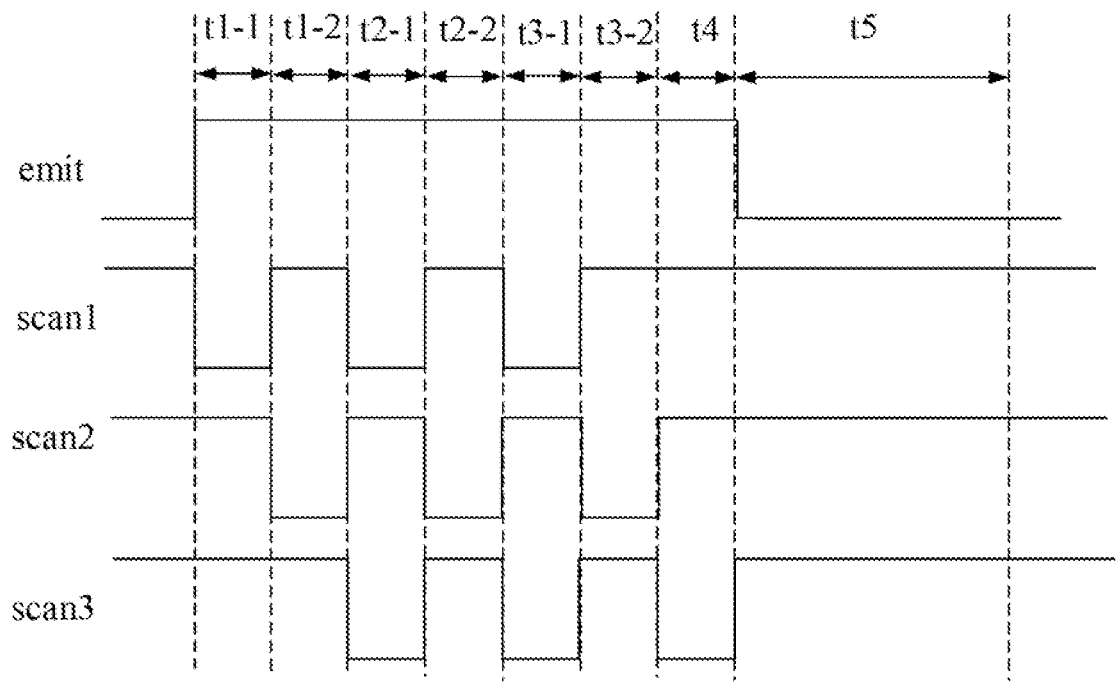
FIG. 13 illustrates a schematic operation timing diagram of another pixel driving circuit consistent with the disclosed embodiments of the present disclosure.

FIG. 13 illustrates a schematic operation timing diagram of another pixel driving circuit. In one embodiment, referring to FIGS. 2, 3 and 13, when the pixel driving circuit 31 is in operation, the operation process of the pixel driving circuit includes a first reset phase t1-1, a first charging phase t1-2, a second reset phase t2-1, a second charging phase t2-2, a third reset phase t3-1, a third charging phase t3-2, a fourth reset phase t4, and a light-emitting phase t5. In the first reset phase t1-1, the reference voltage provided by the reset voltage line vref resets the first node N1 through the first reset transistor T5. In the second reset phase t2-1 and the third reset phase t3-1, the reference voltage provided by the reset voltage line vref resets the first node N1 through the first reset transistor T5, and the reference voltage provided by the reset voltage line vref resets the fourth node N4 through the second reset transistor T7. In the fourth reset stage t4, the reference voltage provided by the reset voltage line vref resets the fourth node N4 through the second reset transistor T7. Compared with FIGS. 11 and 12, in the timing sequence shown in FIG. 13, by resetting the first node N1 and the fourth node N4 a plurality of times, data may be written to the first node N1 a plurality of times, and flickering of the display panel at low gray levels may thus be minimized.

As shown in FIGS. 2 and 3, the repair driving circuit 20 includes the driving transistor T3, the data writing transistor T2, the first reset transistor T5, the second reset transistor T7, the threshold compensation transistor T4, the first light-emitting control transistor T1, the second light-emitting control transistor T6, and the first storage capacitor C. The first electrode of the first light-emitting control transistor T1 is electrically connected to the power supply voltage line PVDD. The second electrode of the first light-emitting control transistor T1 is electrically connected to the first electrode of the driving transistor T3. The gate of the first light-emitting control crystal is electrically connected to the light-emitting control line emit. The first electrode of the first reset transistor T5 is electrically connected to the reset voltage line vref. The second electrode of the first reset transistor T5 is electrically connected to the gate of the driving transistor T3. The gate of the first reset transistor T5 is electrically connected to the first scan line scan1. The first electrode of the threshold compensation transistor T4 is electrically connected to the second electrode of the driving transistor T3. The second electrode of the threshold compensation transistor T4 is electrically connected to the gate of the driving transistor T3. The gate of the threshold compensation transistor T4 is electrically connected to the second scan line scan2. The first electrode of the data writing transistor T2 is electrically connected to the repair data line RDL. The second electrode of the data writing transistor T2 is electrically connected to the first electrode of the driving transistor T3. The gate of the data writing transistor T2 is electrically connected to the second scanning line scan2. The second plate of the first storage capacitor C is electrically connected to the power supply voltage line PVDD. The first plate of the first storage capacitor C is electrically connected to the gate of the driving transistor T3. The first electrode of the second light-emitting control transistor T6 is electrically connected to the second electrode of the driving transistor T3. The gate of the second light-emitting control transistor T6 is electrically connected to the light-emitting control line emit.

As shown in FIG. 2, in the repair driving circuit 20, the second electrode of the second light-emitting control transistor T6 is electrically connected to the second transfer structure X2. The second transfer structure X2 overlaps with the repair connection line 14 in the direction h3 perpendicular to the plane of the substrate. In another embodiment, the second transfer structure X2 and the repair connection line 14 may also be directly electrically connected through a via.

As shown in FIG. 2, in the repair driving circuit 20, the first electrode of the second reset transistor T7 is electrically connected to the lateral reset voltage line vref-1. The third electrode of the second reset transistor T7 is electrically connected to the third transfer structure X3. The third transfer structure X3 overlaps with the repair connection line 14 in the direction h3 perpendicular to the plane of the substrate, and forms the first parasitic capacitance Q1 shown in FIG. 3. Referring to FIGS. 2 and 3, a second parasitic capacitance Q2 is formed at an overlapping portion between the repair connection line 14 and the first transfer structure X1. In FIG. 3, a second parasitic capacitance Q2-1 is formed at an overlapping portion between the repair connection line 14 corresponding to the repair driving circuit 20 and the first transfer structure X1 in a pixel driving circuit 31-1. A second parasitic capacitance Q2-2 is formed at an overlapping portion between the repair connection line 14 corresponding to the repair driving circuit 20 and the first transfer structure X1 in another pixel driving circuit 31-2.

When the repair driving circuit 20 participates in pixel repair, the operation timing of the repair driving circuit 20 is same as the operation timing of the pixel driving circuit 31, and will not be elaborated here.

As shown in FIGS. 2 and 3, the repair driving circuit 20 also includes a second storage capacitor C'. The second plate of the second storage capacitor C' is electrically connected to the power supply voltage line PVDD. The first plate of the second storage capacitor C' is electrically connected to the second electrode of the second reset transistor M7.

The capacitance storage capacity of the second storage capacitor C' may be larger than the capacitance storage capacity of the first storage capacitor C. For example, the capacitance of the second storage capacitor C' may be approximately 3-5 times the capacitance of the first storage capacitor C. When the repair driving circuit 20 participates in pixel repair, that is, when the repair driving circuit 20 is used to drive the light-emitting element 32 to emit light, the second storage capacitor C' may make the repaired light-emitting element turn on slower than other normal light-emitting elements. Accordingly, during low-grayscale display, the light-emitting element may be prevented from producing bright spots.

As shown in FIGS. 2 and 3, the repair driving circuit 20 also includes a repair control transistor M8. A first electrode of the repair control transistor M8 is electrically connected to the second electrode of the second reset transistor M7. A second electrode of the repair control transistor M8 is electrically connected to the second electrode of the second light-emitting control transistor M6 and the repair connection line 14. A gate of the repair control transistor M8 is electrically connected to the light-emitting control line emit.

The repair control transistor M8 is configured to, when the repair driving circuit 20 does not participate in pixel repair, in phases other than the light-emitting phase, avoid repeatedly writing the reference voltage provided by the lateral reset voltage line vref-1 into the parasitic capacitance on the repair connection line 14. Accordingly, repeatedly charging and discharging of the repair connection line 14 may be avoided, and electric energy may be saved.

Figure 14:
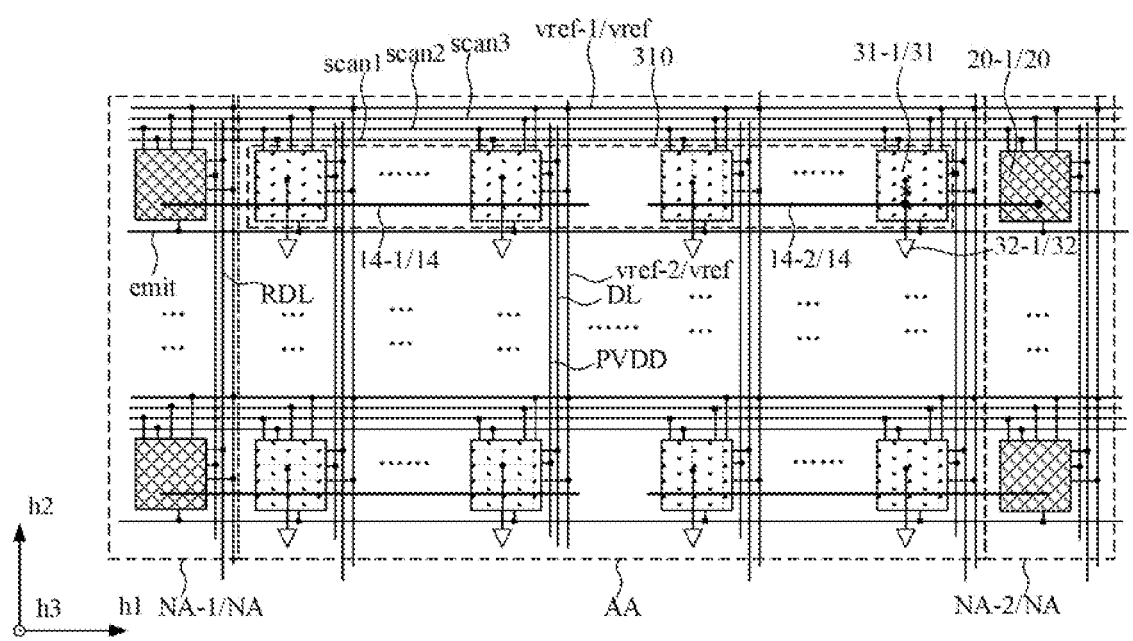
FIG. 14 illustrates a partial schematic diagram of another display panel consistent with the disclosed embodiments of the present disclosure.

FIG. 14 illustrates a partial schematic diagram of another display panel. As shown in FIG. 14, when the pixel driving circuit 31-1 in the display panel fails, the light-emitting element 32-1 corresponding to the pixel driving circuit 31-1 may not emit light normally. In this case, the repair connection line 14-1 and the repair driving circuit 20-1 corresponding to the pixel driving circuit 31-1 may be used to drive the light-emitting element 32-1 to emit light. Specifically, as shown in FIG. 14, when the pixel driving circuit 31-1 fails, the electrical connection between the light-emitting element 32-1 and the pixel driving circuit 31-1 needs to be cut off first. Specifically, as shown in FIG. 3, the electrical connection between the light-emitting element 32 and the second light-emitting control transistor T6 needs to be cut off. The overlapping portion of the repair connection line 14 and the first transfer structure X1 shown in FIG. 2 may then be welded, realizing the electrical connection between the repair connection line 14 and the light-emitting element 32-1. Accordingly, the repair driving circuit 20-1 may drive the light-emitting element 32-1 to emit light through the repair connection line 14.

As shown in FIGS. 2 and 14, when the repair driving circuit 20-1 participates in pixel repair, in addition to the need to electrically connect the light-emitting element 32-1 to the repair connection line 14, the repair driving circuit 20-1 also needs to be electrically connected to the repair connection line 14. That is, it is also necessary to weld the overlapping portions of the second transfer structure X2 and the third transfer structure X3 with the repair connection line 14. In one embodiment, when the second transfer structure X2 is already electrically connected to the repair connection line 14, it is only necessary to weld the overlapping portion between the third transfer structure X3 and the repair connection line 14.

The display panel includes a plurality of pixel driving circuits and a plurality of light-emitting elements. The light-emitting element may emit light of different colors when driven by the pixel driving circuit, thereby realizing picture display. From an end of one light-emitting phase to a start of a next light-emitting phase, a reset signal may be provided to the anode of the light-emitting element, to reset the anode of the light-emitting element to prevent a previous light-emitting phase from affecting light-emitting brightness of a next light-emitting phase. In addition, when the light-emitting element emits light, the potential of the anode of the light-emitting element needs to be charged to a potential capable of emitting light. That is, only when the light-emitting element reaches an operation voltage, the light-emitting element may emit light.

When using the above method to repair defective pixels in the display panel, the repair connection line may be electrically connected to the light-emitting element of the defective pixel. The repair connection lines may overlap with a plurality of pixel driving circuits and a plurality of signal lines (such as data lines) extending in the second direction. In existing technology, the repair connection line may extend from the non-display area on one side of the display panel to the non-display area on the other side. Accordingly, large parasitic capacitance may be introduced on the repair connection line. When it is necessary to reset the light-emitting element connected to the repair connection line, the large parasitic capacitance, that is, a large amount of charge on the repair connection line, and the limited reset time, may result in insufficient writing of the reset voltage signal on the reset voltage line. Accordingly, the reset voltage signal may not be fully written into the anode of the corresponding light-emitting element. As a result, the operation voltage of the anode of the light-emitting element may be insufficiently written during the light-emitting phase, resulting in abnormal display.

In the display panel provided by the present disclosure, by setting at least two repair connection lines corresponding to one pixel driving circuit row, repair connection lines penetrating the display panel may be avoided. The length of each repair connection line may be reduced. As such, for each repair connection line, the quantity of pixel driving circuits overlapping with the repair connection line and the quantity of signal lines extending along the second direction may be reduced, and the parasitic capacitance on the repair connection line may be reduced. Accordingly, when resetting the anode of the light-emitting element before emitting light, the reset voltage signal on the reset voltage line may be fully written. The anode of the light-emitting element may be fully written with the corresponding reset voltage signal and the operation voltages of subsequent light-emitting phases. As such, the light-emitting element driven by the repair driving circuit may emit light normally.

Figure 15:
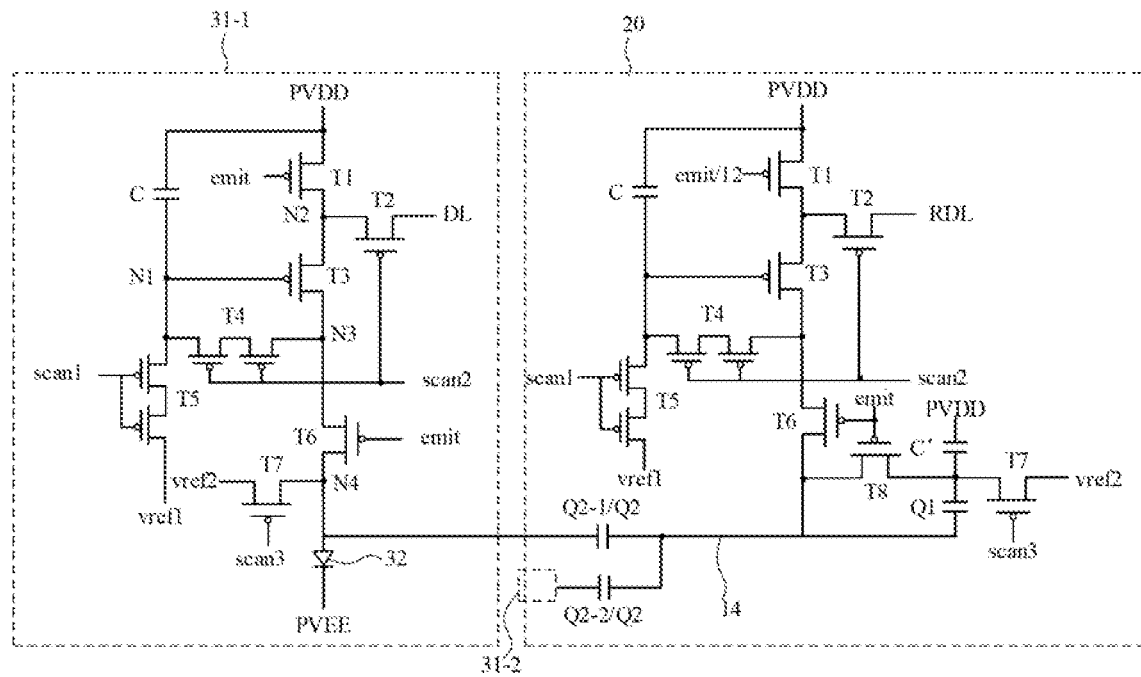
FIG. 15 illustrates a schematic circuit diagram of another display panel consistent with the disclosed embodiments of the present disclosure.

In the pixel driving circuit 31 and the repair driving circuit 20 shown in FIGS. 1 to 3, the lateral reset voltage line vref−1 and the vertical reset voltage line vref−2 are electrically connected. As such, the first reset transistor T5 and the second reset transistor T7 may have a same reset voltage. In another embodiment, the lateral reset voltage line vref−1 and the vertical reset voltage line vref−2 may be insulated from each other to transmit different reset voltages. FIG. 15 illustrates a schematic circuit diagram of another display panel. As shown in FIG. 15, the first reset transistor T5 is electrically connected to the first reset voltage line vref1, and the second reset transistor T7 is electrically connected to the second reset voltage line vref2. Based on the circuit schematic diagram shown in FIG. 15 and other contents of the present disclosure without exerting creative work, those skilled in the art may implement corresponding circuit layouts, which will not be elaborated here.

Optionally, the first insulating layer 101 includes an inorganic material, such as silicon nitride, silicon oxynitride, silicon oxide, titanium oxide, aluminum oxide, or a combination thereof.

Optionally, the second insulating layer 102 includes an inorganic material such as silicon nitride, silicon oxynitride, silicon oxide, titanium oxide, aluminum oxide, or a combination thereof. In some implementations, the second insulating layer 102 may include a plurality of inorganic layers.

Optionally, the third insulating layer 103 includes an inorganic layer, such as a silicon nitride layer, a silicon oxynitride layer, a silicon oxide layer, a titanium oxide layer, an aluminum oxide layer, or a combination thereof.

Optionally, the fourth insulating layer 104 includes an organic insulating material, such as acrylic resin, epoxy resin, phenolic resin, polyamide resin, polyimide resin, or a combination thereof. In some implementations, the fourth insulating layer 104 may include a plurality of organic layers.

Optionally, the fifth insulating layer 105 includes an organic insulating material, such as acrylic resin, epoxy resin, phenolic resin, polyamide resin, polyimide resin, or a combination thereof. In some embodiments, the five insulating layers 105 may include a plurality of organic layers.

In some embodiments, taking FIG. 1 as an example, along the first direction h1, a sum of lengths of the at least two repair connection lines 14 corresponding to a same pixel driving circuit row 310 is less than the length of the pixel driving circuit row 310.

In existing technology, the repair connection line 14 may pass through the pixel driving circuit row 310 along the first direction h1. The length of the repair connection line 14 may be greater than or equal to the length of the pixel driving circuit row 310. In one embodiment of the present disclosure, one pixel driving circuit row 310 is provided with a plurality of repair connection lines 14 correspondingly. A gap may exist between two adjacent repair connection lines 14, and the parasitic capacitance on each repair connection line 14 may thus be further reduced. It may be understood that the plurality of repair connection lines 14 corresponding to a same pixel driving circuit row 310 may be disposed on a same virtual straight line. That is, when any repair connection line is extended along the first direction, the repair connection line will overlap with other repair connection lines corresponding to the pixel driving circuit row. Accordingly, the positional relationship between different repair connection lines and corresponding pixel driving circuits may be consistent, and display uniformity may be improved.

In some embodiments, as shown in FIG. 1, the display panel also includes a non-display area NA. The non-display area NA at least partially surrounds the display area AA. As shown in FIG. 1, in one embodiment, the non-display area NA includes a first non-display area NA−1 and a second non-display area NA−2 disposed on two sides of the display area AA. The first non-display area NA−1 and the second non-display area NA−2 each include a repair driving circuit 20. The repair driving circuits 20 are disposed on two sides of the display area AA along the first direction h1.

As shown in FIGS. 1 and 2, the pixel driving circuits 31 may be arranged in neat rows and columns in the display area AA. Signal traces connected to the pixel driving circuits 31 extend along the first direction h1 or the second direction h2 overall. By disposing the repair driving circuit 20 in the non-display area NA, the repair driving circuit 20 may not disturb the layout of the pixel driving circuit 31 and signal traces in the display area AA. As such, the production and manufacturing efficiency of the display panels may be improved. As shown in FIG. 1, along the first direction h1, a pixel driving circuit row 310 is provided with two repair connection lines 14 correspondingly, and includes X pixel driving circuits. In the pixel driving circuit row 310, n pieces of pixel driving circuits 31 are correspondingly provided with a repair connection line 14-1, and m pieces pixel driving circuits 31 are correspondingly provided with another repair connection line 14-2, where n, m, and X each are positive integers, and n+m=X.

By setting n+m=X, each pixel driving circuit 31 in the pixel driving circuit row 310 may overlap with the repair connection line 14. Accordingly, each pixel driving circuit 31 in the pixel driving circuit row 310 may use the repair driving circuit 20 to drive a corresponding light-emitting element 32 to emit light when the pixel driving circuit 31 may not drive the corresponding light-emitting element to emit light normally.

In some embodiments, $|n-m| \leq 10$. That is, for each pixel driving circuit row 310, quantities of pixel driving circuits 31 corresponding to the two repair connection lines 14 corresponding to the pixel driving circuit row 310 are approximately equal. Lengths of the two repair connection lines 14 are also approximately equal, further reducing the parasitic capacitance existing on the two repair connection lines 14. As such, when resetting the anode of the light-emitting element before emitting light, the reset voltage signal on the reset voltage line may be fully written through the repair connection line. The anode of the light-emitting element may be fully written with the corresponding reset voltage signal and the operation voltage of the subsequent light-emitting phase. Accordingly, the light-emitting element driven by the repair driving circuit may emit light normally.

In addition, since the quantities of pixel driving circuits corresponding to the two repair connection lines are approximately equal, failure probabilities of the pixel driving circuits corresponding to the two repair connection lines may also be approximately equal. The failure probabilities of the pixel drive circuits corresponding to the two repair connection lines may also be approximately equal. Accordingly, the utilization rate of the repair driving circuits and the fault tolerance rate of the pixel driving circuits may be improved.

It should be noted that in an actual display panel, one pixel circuit driving row may include hundreds or thousands of pixel driving circuits. For example, in existing technology, a display panel may have a resolution of 3456*2160. It may be roughly understood that the display panel has 3456 pixel circuit driving rows, and each pixel circuit driving row includes 2160 pixel driving circuits. In this case, when the difference in the quantities of pixel driving circuits corresponding to the two repair connection lines is less than 10, the quantities of pixel driving circuits corresponding to the two repair connection lines may be considered to be approximately equal.

In one embodiment, $|n-m| \leq 1$. When one pixel driving circuit row 310 includes an even quantity of pixel driving circuits 31, $n=m$. When one pixel driving circuit row 310 includes an odd quantity of pixel driving circuits 31, $n=m+1$. By dividing the pixel driving circuits 31 in a pixel driving circuit row 310 into two equal parts as much as possible, the parasitic capacitance existing on each repair connection line may be further reduced, and the utilization rate of the repair driving circuits and the fault tolerance rate of the pixel driving circuits may be further improved.

Figure 16:
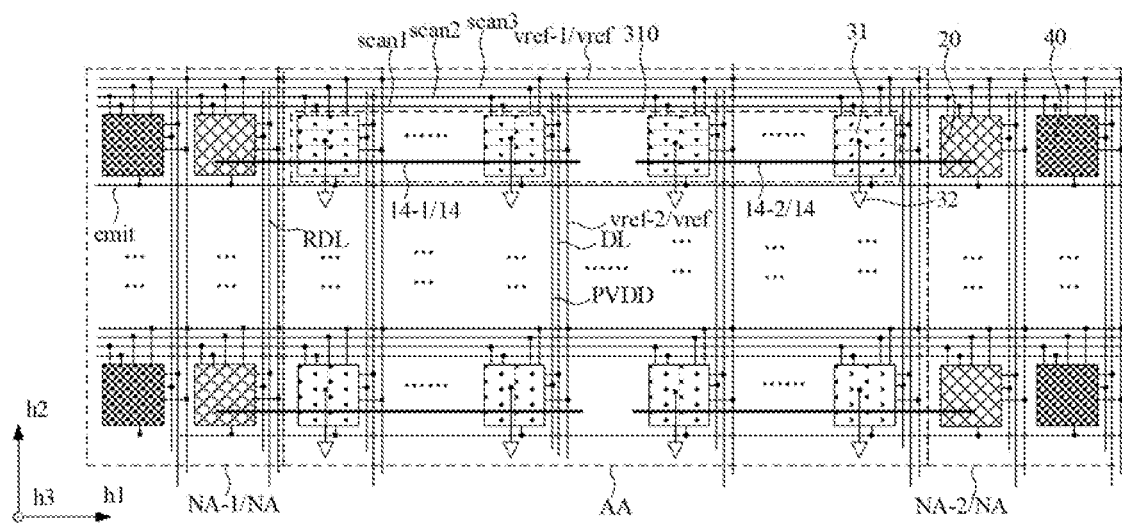
FIG. 16 illustrates a partial schematic diagram of another display panel consistent with the disclosed embodiments of the present disclosure.

FIG. 16 illustrates a partial schematic diagram of another display panel. In some embodiments, as shown in FIG. 16, the non-display area NA may also include a dummy pixel driving circuit 40, disposed on a side of the repair driving circuit 20 away from the display area AA.

During a manufacturing process of a display panel, conductive materials (conductive parts in the pixel structure, such as gates, sources and drains of transistors, plates of capacitors, signal lines, anodes of light-emitting elements, etc.) need to be etched. To improve the consistency of the etching environment at edge positions and middle positions in the display area AA, when forming the pixel driving circuits 20 in the display area AA, a dummy pixel driving circuit 40 may be simultaneously formed in the non-display area NA adjacent to the display area AA. As a result, the etching effect at the edge position and the middle position in the display area AA may be more consistent, and display uniformity of the display panel may be improved.

The dummy pixel driving circuit 40 is usually unable to drive the light-emitting element to emit light, because of various reasons. For example, the display panel may not be provided with a light-emitting element electrically connected to the dummy pixel driving circuit 40; or there may be electrically connected light-emitting elements, but the pixel definition layer between the anode and the cathode of the light-emitting element may not be removed; or the dummy pixel driving circuit 40 may lack some structures compared to a normal pixel driving circuit 20, making the dummy pixel driving circuit 40 unable to work properly. It may be understood that the dummy pixel driving circuit 40 may be configured to have a same structure as the pixel driving circuit, except that the dummy pixel driving circuit 40 may not drive the light-emitting element to emit light.

The dummy pixel driving circuits 40 are usually disposed around the display pixels in the display area, and may be set in a plurality of rows or columns. Specific arrangement of the dummy pixel driving circuits 40 may be selected according to the needs of the display panel. When the repair driving circuit is used to drive the light-emitting element in the display area to emit light, the repair driving circuit is equivalent to the pixel driving circuit. Accordingly, the dummy pixel driving circuit may be disposed on a side of the repair driving circuit close to the display area, or may be disposed on a side of the repair driving circuit away from the display area. The location of the dummy pixel driving circuit may be chosen according to actual needs. FIG. 16 only illustrates that the dummy pixel driving circuit may be disposed on a side of the repair driving circuit away from the display area.

It may be understood that when the repair driving circuit is not used to drive the light-emitting elements in the display area to emit light, the repair driving circuit may be multiplexed as a dummy pixel driving circuit and achieve a same effect as the dummy pixel driving circuit.

Figure 17:
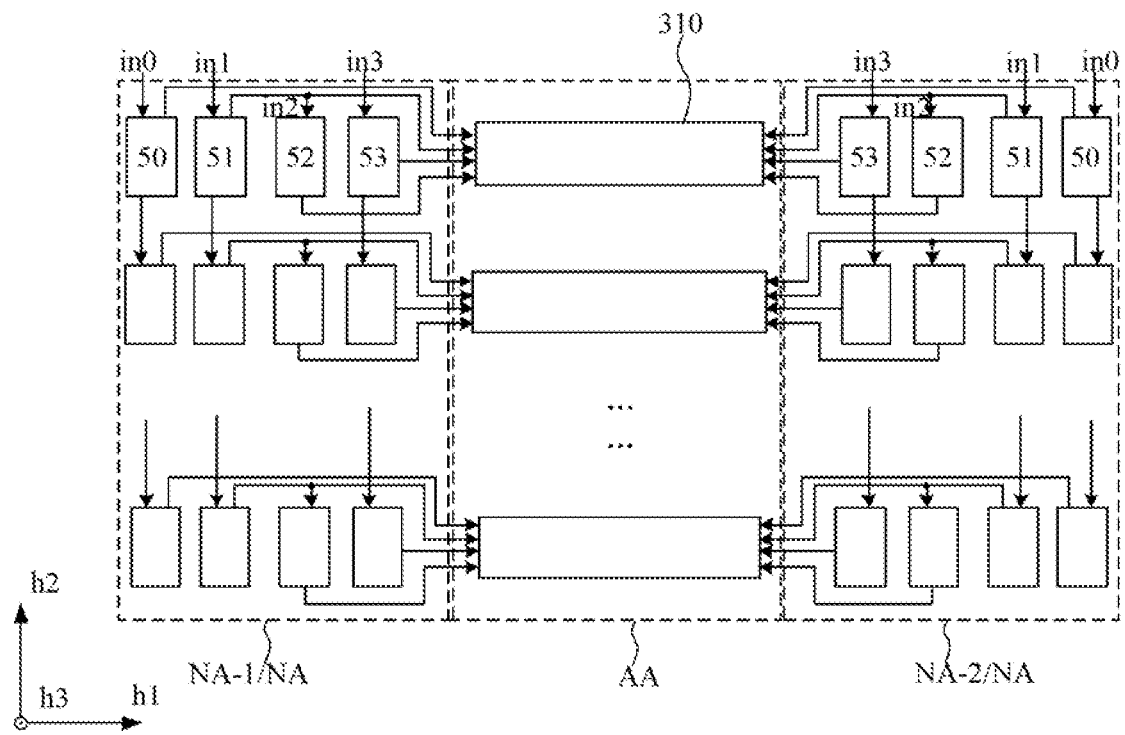
FIG. 17 illustrates a partial schematic diagram of another display panel consistent with the disclosed embodiments of the present disclosure.

In one embodiment, the display panel also includes a peripheral driving circuit in the non-display area NA. FIG. 17 illustrates a partial schematic diagram of another display panel. As shown in FIG. 17, the peripheral driving circuit includes a light-emitting control circuit 50 connected to the light emission control line emit, a first scan control circuit 51 connected to the first scan line scan1, a second scan control circuit 52 connected to the second scan line scan2, and a third scan control circuit 53 connected to the third scan line scan3. When the non-display area NA includes the repair driving circuit 20, the peripheral driving circuit may be disposed on a side of the repair driving circuit 20 away from the display area AA.

As shown in FIGS. 1 and 17, the light-emitting control circuit 50 may receive a first input signal in0 and provide a light-emitting control signal to the light-emitting control line emit according to the first input signal in0. The first scan control circuit 51 may receive a second input signal in1 and provide a first scan control signal to the first scan line scan1 according to the second input signal in1. The second scan control circuit 52 may receive a third input signal in2 and provide a second scan control signal to the second scan line scan2 according to the third input signal in2. The third input signal in2 received by the second scan control circuit 52 is the first scan control signal output by the first scan control circuit 51. The third scan control circuit 53 may receive a third input signal in3 and provide a third scan control signal to the third scan line scan3 according to the third input signal in3. The signal timing provided by the light-emitting control circuit 50, the first scan control circuit 51, the second scan control circuit 52 and the third scan control circuit 53 may be referred to FIGS. 11-13. A same peripheral driving circuits corresponding to different pixel circuit driving rows 310 may transmit corresponding input signals in a cascaded manner. The corresponding light-emitting control signal, the corresponding first scanning control signal, the corresponding second scanning control signal and the corresponding third scanning control signal may be sequentially provided to each pixel circuit driving row 310 according to a direction of the input signal transmission sequences.

Figure 18:
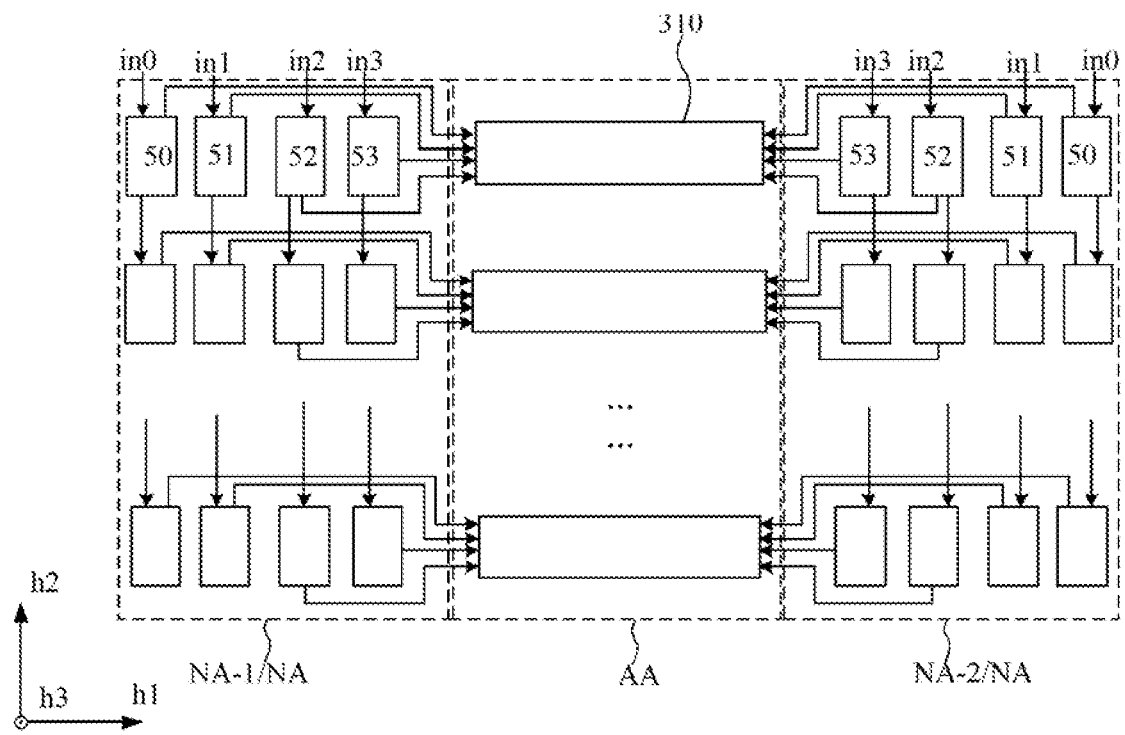
FIG. 18 illustrates a partial schematic diagram of another display panel consistent with the disclosed embodiments of the present disclosure.

FIG. 18 illustrates a partial schematic diagram of another display panel. In another embodiment, as shown in FIGS. 1 and 18, the light-emitting control circuit 50 may receive a first input signal in0 and provide a light-emitting control signal to the light-emitting control line emit according to the first input signal in0. The first scan control circuit 51 may receive a second input signal in1 and provide a first scan control signal to the first scan line scan1 according to the second input signal in1. The second scan control circuit 52 may receive a third input signal in2 and provide a second scan control signal to the second scan line scan2 according to the third input signal in2. The third scan control circuit 53 may receive a third input signal in3 and provide a third scan control signal to the third scan line scan3 according to the third input signal in3. Different from FIG. 17, in the embodiment shown in FIG. 18, the third input signal in2 received by the second scan control circuit 52 does not depend on the second input signal in1 and the first scan control circuit 51. The signals provided by the light-emitting control circuit 50, the first scan control circuit 51, the second scan control circuit 52 and the third scan control circuit 53 may be referred to FIG. 11, 12 or 13. A same peripheral driving circuit corresponding to different pixel circuit driving rows 310 may transmit the corresponding input signals in a cascade manner. The corresponding light-emitting control signal, the corresponding first scanning control signal, the corresponding second scanning control signal and the corresponding third scanning control signal may be sequentially provided to each pixel circuit driving row 310 according to the direction of the input signal transmission sequences.

Figure 19:
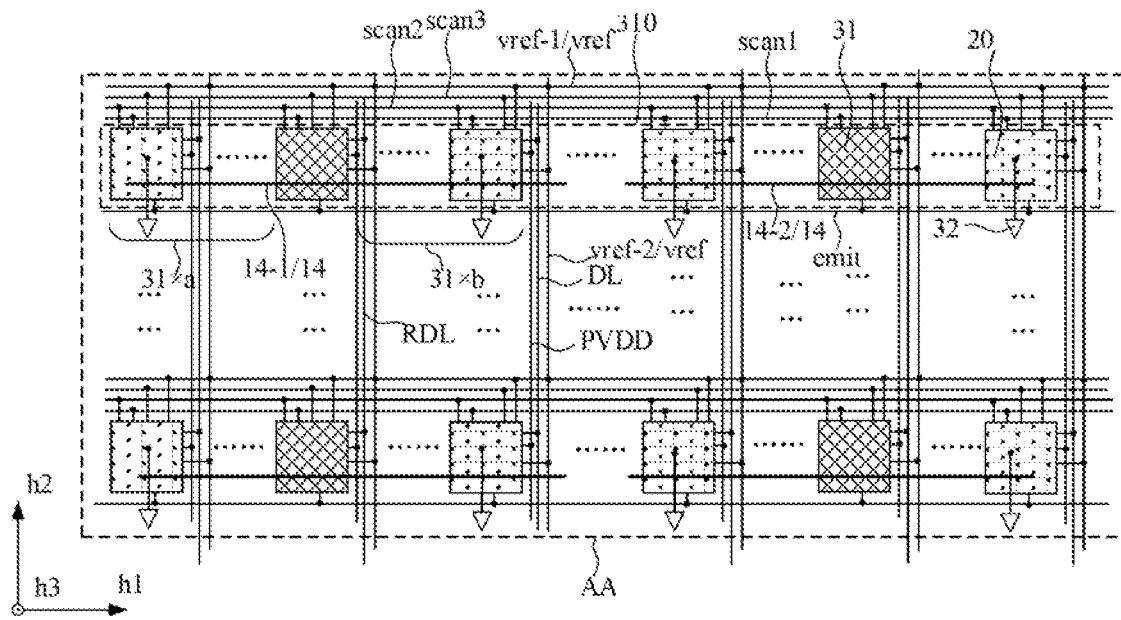
FIG. 19 illustrates a partial schematic diagram of another display panel consistent with the disclosed embodiments of the present disclosure.

FIG. 19 illustrates a partial schematic diagram of another display panel. In some embodiments, as shown in FIG. 19, the repair driving circuit 20 may be disposed in the pixel driving circuit row 310. That is, the repair driving circuit 20 may be disposed in the display area AA.

By disposing the repair driving circuit 20 in the display area AA, a frame width of the display panel may be reduced to a certain extent. In addition, since the display panel provided by the present disclosure may be applied in medium-sized products (such as notebooks, tablets, plug-in car display screens, etc.), there may be a large space in the display area for disposing the repair driving circuit 20, and the display effect of the display panel may not be affected.

In some embodiments, one pixel driving circuit row 310 may be correspondingly disposed with at least three repair driving circuits 20, and at least one repair driving circuit 20 is disposed in the display area AA.

By disposing the repair driving circuits 20 in the display area AA, each pixel driving circuit row 310 may be disposed with more repair driving circuits 20 and repair connection lines 14. Accordingly, each repair connection line 14 may be shortened, and the parasitic capacitance on each repair connection line 14 may be reduced. In addition, by disposing the repair driving circuits 20 in the display area AA, the whole display panel may include more repair driving circuits. The fault tolerance rate of the display panel may be improved, and the product yield may be improved.

In FIG. 19, one pixel driving circuit row 310 is disposed with two repair driving circuits 20 correspondingly. FIG. 19 is exemplary only. In an actual display panel, three or more repair driving circuits 20 may be disposed in one pixel driving circuit row 310.

Figure 20:
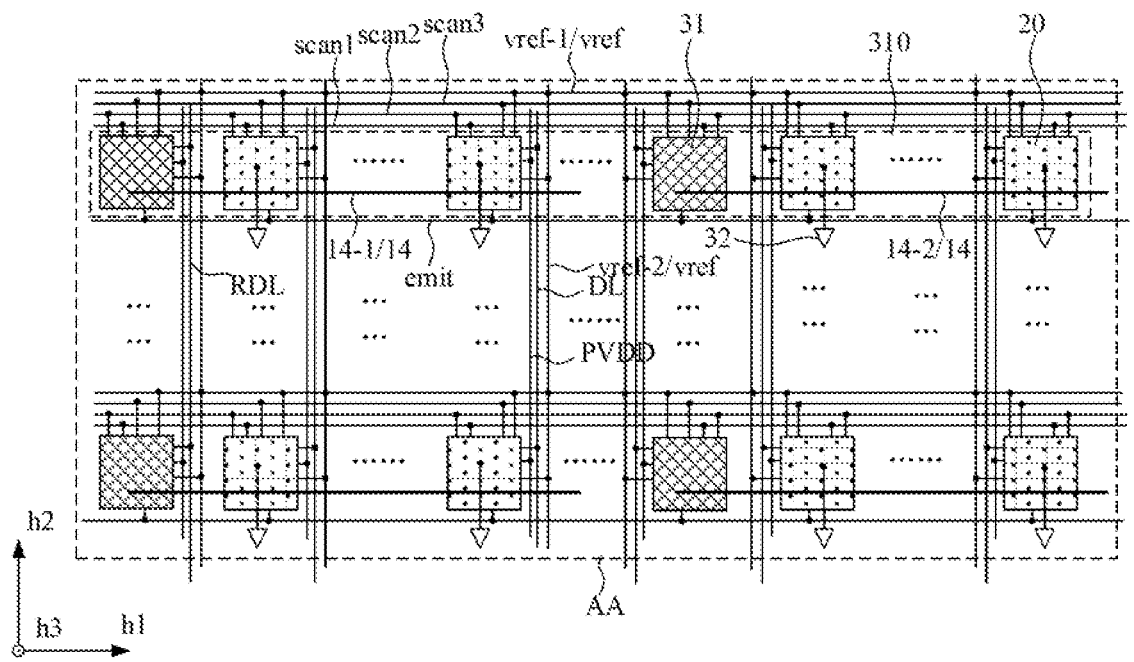
FIG. 20 illustrates a partial schematic diagram of another display panel consistent with the disclosed embodiments of the present disclosure.

In some embodiments, the repair driving circuit 20 is disposed in the display area AA, and the pixel driving circuit row 310 is disposed with at least two repair driving circuits 20. Accordingly, each pixel driving circuit 31 in the pixel driving circuit row 310 may use the repair driving circuit 20 to drive the corresponding light-emitting element 32 to emit light when the pixel driving circuit 31 may not drive the corresponding light-emitting element to emit light normally. The non-display area NA around the display area AA may not include the repair driving circuit 20 but include the dummy pixel driving circuit 40. FIG. 20 illustrates a partial schematic diagram of another display panel. In some embodiments, as shown in FIG. 20, the corresponding pixel driving circuits 31 of a repair driving circuit 20 may be disposed on a same side of the repair driving circuit 20 along the first direction h1.

It should be noted that one repair connection line may correspond to one repair driving circuit and a plurality of pixel driving circuits. In the present disclosure, when a repair driving circuit and a plurality of pixel driving circuits correspond to a same repair connection line, it may be understood that the repair driving circuit corresponds to the plurality of pixel driving circuits.

In other embodiments, as shown in FIG. 19, along the first direction h1, in a same pixel driving circuit row 310, among P pieces of pixel driving circuits 31 corresponding to a same repair connection line 14, a pieces of pixel driving circuit 31 are disposed on one side of the repair driving circuit 20, and b pieces of pixel driving circuits 31 are disposed on the other side of the repair driving circuit 20, where P=a+b, and P, a, and b are each positive integers.

In one embodiment, one repair connection line 14 corresponds to 100 pixel driving circuits 31. Among the 100 pixel driving circuits 31, 30 pixel driving circuits 31 are disposed on one side of the repair driving circuit 20, and 70 pixel driving circuits 31 are disposed on the other side of the repair driving circuit 20. That is, P=100, a=30, b=70. In an actual display panel, due to different sizes of different display panels, the quantity of pixel driving circuits 31 in a corresponding pixel driving circuit row 310 may be different. Therefore, other values of P, a, and b may be selected according to actual situations.

The pixel driving circuits 31 corresponding to a repair driving circuit 20 are disposed on two sides of the repair driving circuit 20. The situation may be avoided, where the pixel driving circuit 31 to be repaired is too far away from the corresponding repair driving circuit 20 resulting in display delay.

In some embodiments, |a−b|≤10. That is, quantities of corresponding pixel driving circuits 31 disposed on two sides of a repair driving circuit 20 are approximately equal. The situation may be avoided, where the pixel driving circuit 31 to be repaired is too far away from the corresponding repair driving circuit 20 resulting in display delay.

It should be noted that in an actual display panel, one pixel circuit driving row may include hundreds or thousands of pixel driving circuits. For example, in existing technology, a display panel may have a resolution of 3456*2160. It may be roughly understood that the display panel may have 3456 pixel circuit driving rows, and each pixel circuit driving row may include 2160 pixel driving circuits. Even if 10 repair driving circuits and 10 repair connection lines are disposed in one pixel driving circuit row, approximately 200 pixel driving circuits need to be set for each repair connection line. In this case, when the difference in the quantities of corresponding pixel driving circuits on two sides of the repair driving circuit is less than 10, the quantities of corresponding pixel driving circuits disposed on two sides of the repair driving circuit may be considered to be approximately equal.

In one embodiment, |a−b|≤1. Specifically, when a repair driving circuit corresponds to an even number of pixel driving circuits, a=b. When a repair driving circuit corresponds to an odd number of pixel driving circuits, a−b=1. By setting up a same quantity of pixel driving circuits on two sides of a repair driving circuit as much as possible, the situation may be avoided, where the pixel driving circuit to be repaired is too far away from the corresponding repair driving circuit, causing display delay.

In some embodiments, at least two repair connection lines 14 are correspondingly provided with a same quantity of pixel driving circuits 31. That is, at least two repair driving circuits 20 are correspondingly provided with the same quantity of pixel driving circuits 31. When any pixel driving circuit 31 in the display panel may not drive the corresponding light-emitting element to emit light normally, the distance between the corresponding light-emitting element 32 and the corresponding repair driving circuit 20 may not be too different. Accordingly, display difference may be avoided, when the repair driving circuit 20 drives the light-emitting element 32 to emit light.

In a specific embodiment, each repair connection line 14 is disposed with a same quantity of pixel driving circuits 31. In addition, the quantities of the pixel driving circuits 31 disposed on two sides of the repair driving circuit 20 corresponding to the repair connection line 14 is approximately equal, as shown in FIG. 19. Accordingly, the repair driving circuits 20 disposed in different pixel driving circuit rows 310 may overlap in a second direction h2 (the second direction h2 intersects the first direction h1). As such, the repair data line RDL, the power supply voltage line PVDD and the vertical reset voltage line vref-2 corresponding to the repair driving circuit 20 disposed in different pixel driving circuit rows 310 may be laid out in a substantially straight line. As a result, the overall wiring layout of the display panel may be simplified.

Figure 21:
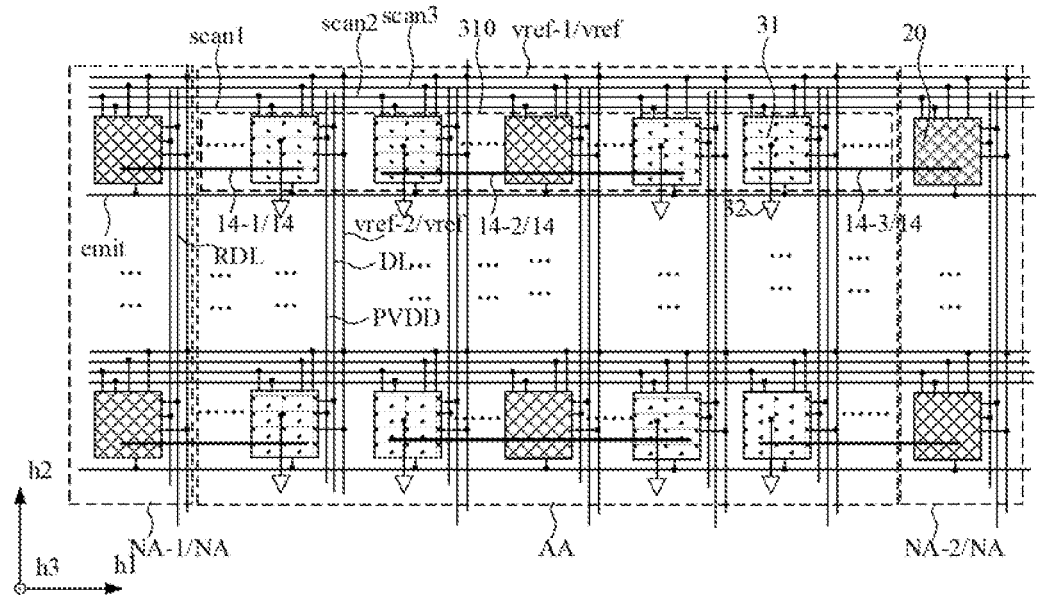
FIG. 21 illustrates a partial schematic diagram of another display panel consistent with the disclosed embodiments of the present disclosure.

FIG. 21 illustrates a partial schematic diagram of another display panel. In a specific embodiment, as shown in FIG. 21, the display area AA and the non-display area NA of the display panel may simultaneously include a repair driving circuit 20. In FIG. 21, the repair driving circuits 20 are disposed in the display area AA and the two non-display areas NA on two sides of the display area AA. Of course, the repair driving circuits 20 may be disposed only on the display area AA and one non-display areas NA on one side of the display area AA. Those skilled in the art may use the embodiment shown in FIG. 21 combined with other embodiments of the present disclosure to obtain new embodiments without exerting creative efforts. Such embodiments are within the protection scope of the present disclosure, and will not be elaborated here.

Figure 22:
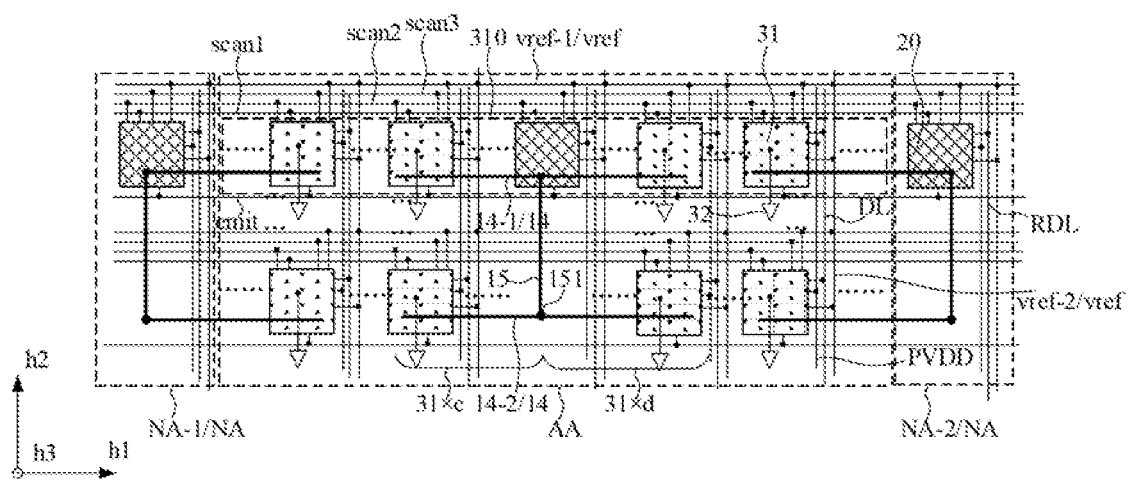
FIG. 22 illustrates a partial schematic diagram of another display panel consistent with the disclosed embodiments of the present disclosure.

FIG. 22 illustrates a partial schematic diagram of another display panel. In some embodiments, as shown in FIG. 22, the display panel may include an inter-row connection line 15. The inter-row connection line 15 extends along the second direction h2. The first direction h1 and the second direction h2 intersect. One inter-row connection line 15 is electrically connected to at least two repair connection lines 14.

Specifically, as shown in FIG. 22, the repair connection lines 14 electrically connected to a same inter-row connection line 15 may be correspondingly disposed with a same repair driving circuit 20. As such, the repair driving circuit 20 may be disposed corresponding to pixel driving circuits 31 in different pixel driving circuit rows, and layout flexibility of the repair driving circuit 20 may be improved.

Parasitic capacitance may also exist in the inter-row connection line 15. Operationally, to prevent the overall parasitic capacitance of the inter-row connection line 15 and the repair connection lines 14 connected to the inter-row connection line 15 from being too large, when a repair driving circuit 20 is provided corresponding to the pixel driving circuits 31 disposed in different pixel driving circuit rows through the inter-row connection line 15, the quantity of the pixel driving circuits 31 disposed in each pixel driving circuit row, corresponding to the repair driving circuit 20, may be relatively reduced. Accordingly, flexibility in repairing the display panel may be improved.

Figure 23:
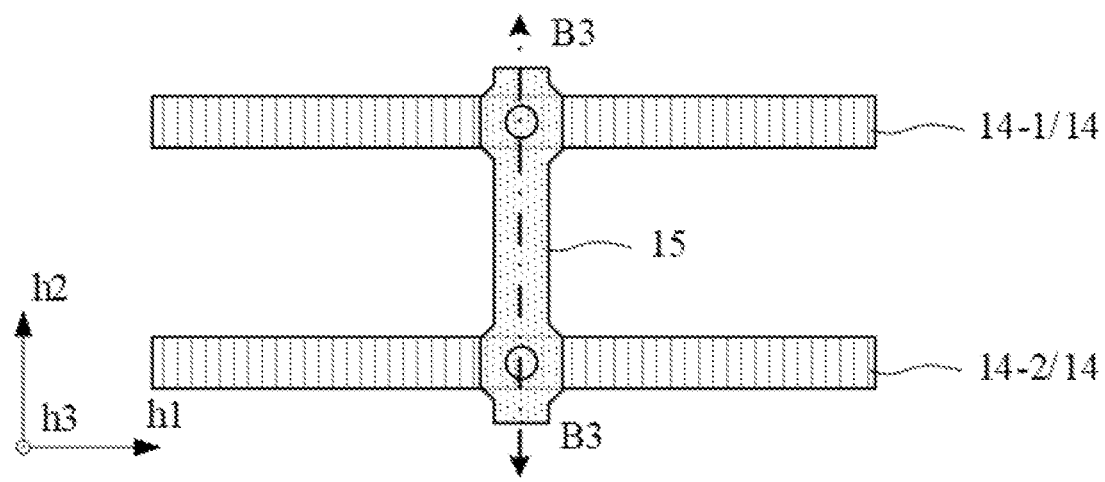
FIG. 23 illustrates a partial wiring diagram of another display panel consistent with the disclosed embodiments of the present disclosure.
Figure 24:
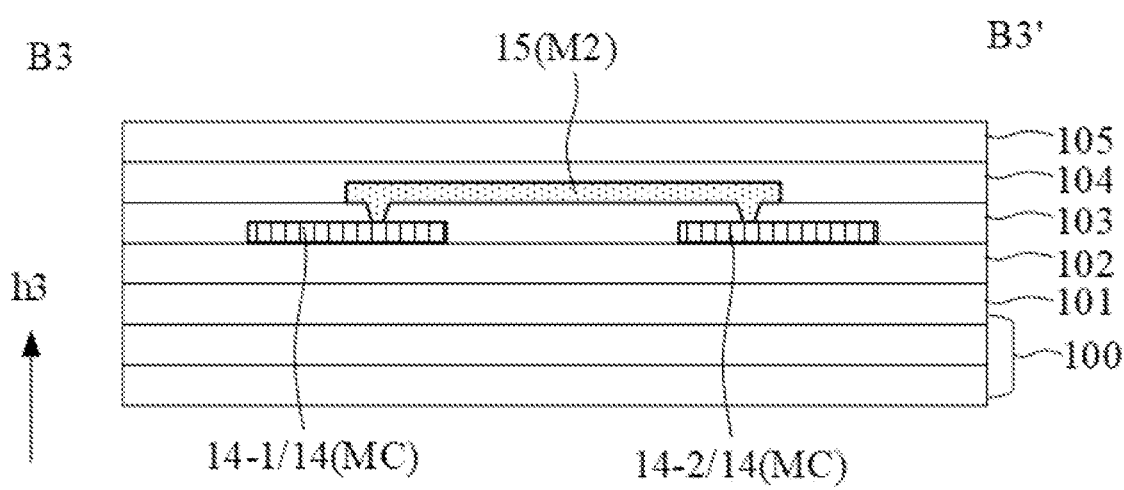
FIG. 24 illustrates a partial cross-sectional schematic diagram of another display panel consistent with the disclosed embodiments of the present disclosure.

FIG. 23 illustrates a partial wiring diagram of another display panel consistent with the disclosed embodiments of the present disclosure. FIG. 24 illustrates a partial cross-sectional schematic diagram of another display panel consistent with the disclosed embodiments of the present disclosure. FIG. 24 is a cross-sectional view along B3-B3′ direction in FIG. 23. Specifically, as shown in FIGS. 23 and 24, at least part of the inter-row connection lines 15 is disposed on the second metal layer M2. At least part of the repair connection line 14 is disposed on the capacitor metal layer MC. The second metal layer M2 is disposed on a side of the capacitor metal layer MC away from the substrate 100. The inter-row connection lines 15 and the repair connection lines 14 are electrically connected through a via at an overlapping portion.

Figure 25:
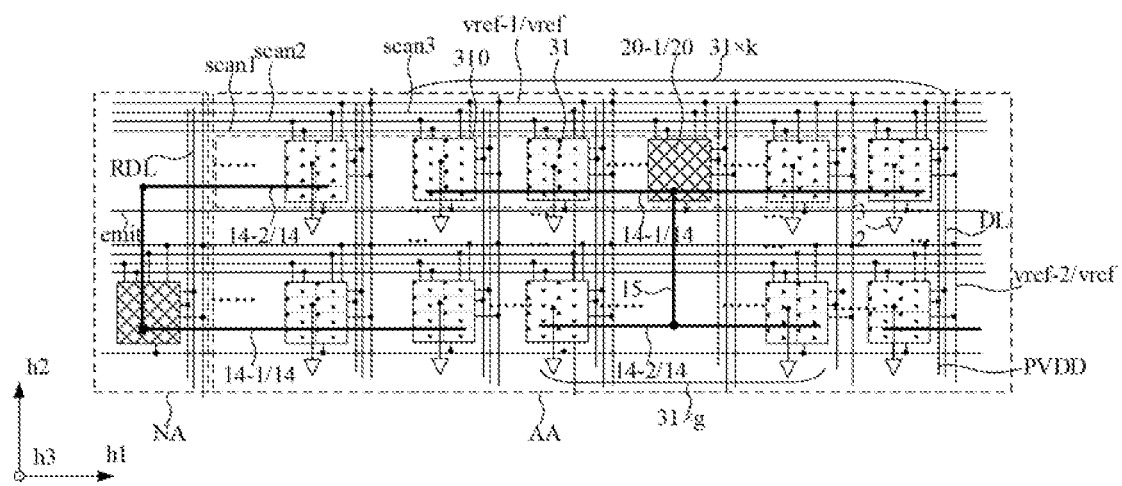
FIG. 25 illustrates a partial schematic diagram of another display panel consistent with the disclosed embodiments of the present disclosure.

In some embodiments, the quantities of pixel driving circuits 31 disposed corresponding to the at least two repair connection lines 14 electrically connected to a same inter-row connection line 15 may be equal. FIG. 25 illustrates a partial schematic diagram of another display panel consistent with the disclosed embodiments of the present disclosure. In some other embodiments, as shown in FIG. 25, the inter-row connection line 15 may be electrically connected to one first repair connection line 14-1 and at least one second repair connection line 14-2. Along the direction h3 perpendicular to the plane of the substrate, only the first repair connection line 14-1 at least partially overlaps with the repair driving circuit 20. The quantity of pixel driving circuits 31 provided corresponding to the second repair connection line 14-2 is g. The quantity of pixel driving circuits 31 provided corresponding to the first repair connection line 14-1 is k, where g<k, and g and k each are positive integers.

As shown in FIG. 25, when the repair driving circuit 20-1 participates in repairing the pixel driving circuit 31 provided corresponding to the second repair connection line 14-2, the existence of the inter-row connection line 15 may increase the distance from the repair driving circuit 20-1 to the pixel driving circuit 31 provided corresponding to the second repair connection line 14-2. As such, the quantity of the pixel driving circuits 31 provided corresponding to the second repair connection lines 14-2 may be relatively reduced. The distance from the pixel driving circuit 31 corresponding to the second repair connection line 14-2 to the corresponding repair driving circuit 20 may not be too far compared to the pixel driving circuit 31 provided corresponding to the first repair connection line 14-1. Accordingly, display delay may be avoided, and the overall parasitic capacitance of the inter-row connection line 15 and the repair connection lines 14 connected to the inter-row connection line 15 may also be reduced.

Optionally, as shown in FIG. 25, within a pixel circuit driving row 310, the second repair connection line 14-2 connected to one inter-row connection line 15 is adjacent to the first repair connection line 14-1 connected to another inter-row connection line 15. When the quantities of the pixel driving circuits 31 corresponding to the plurality of repair connection lines 14 connected to one inter-row connection line 15 are not equal, the pixel driving circuits 31 corresponding to the repair driving circuit 20 each are distributed in a staircase shape at the edges as shown in FIG. 25. In one pixel circuit driving row 310, the second repair connection lines 14-2 and the first repair connection lines 14-1 are alternately distributed, such that each pixel driving circuit 31 in the pixel driving circuit row 310 may use the repair driving circuit 20 to drive the corresponding light-emitting element 32 to emit light when the pixel driving circuit 31 may not drive the corresponding light-emitting element to emit light normally.

In some embodiments, as shown in FIG. 22, along the second direction h2, the inter-row connection line 15 at least partially overlaps with the repair driving circuit 20.

Specifically, when the repair driving circuit 20 participates in pixel repair, the overlapping of the inter-row connection lines 15 and the repair driving circuit 20 may make the path from the repair driving circuit 20 to any pixel driving circuit 31 to be repaired and light-emitting element 32 electrically connected to the pixel driving circuit 31 be the shortest, and display delay may be avoided.

Figure 26:
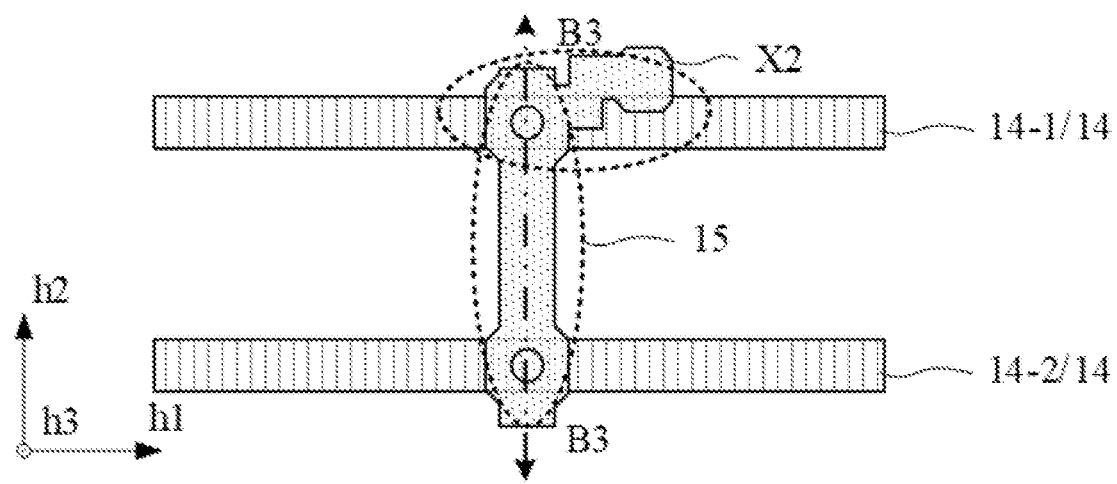
FIG. 26 illustrates a partial wiring diagram of another display panel consistent with the disclosed embodiments of the present disclosure.

FIG. 26 illustrates a partial wiring diagram of another display panel. Specifically, as shown in FIG. 26, the inter-row connection line 15 at least partially overlaps with the repair driving circuit 20. In one embodiment, the inter-row connection line 15 at least partially overlaps with the second transfer structure X2 in the repair driving circuit 20. When the inter-row connection lines 15 and the second transfer structure X2 each are disposed on the second metal layer M2, the inter-row connection line 15 may be directly connected to the second transfer structure X2 on the second metal layer M2, and simultaneously may be connected to the repair connection lines 14 through a via.

In some embodiments, as shown in FIG. 22, the inter-row connection line 15 may overlap with the repair driving circuit 20 along the second direction Y. Among K pieces of pixel driving circuits 31 corresponding to a same repair connection line 14, c pieces of pixel driving circuits 31 are disposed on one side of the overlapping portion 151 of the repair connection line 14 and the inter-row connection line 15, d pieces of pixel driving circuits 31 are disposed on the other side of the overlapping portion 151 of the repair connection line 14 and the inter-row connection line 15, where K=c+d, $|c-d|\leq 10$, K, c, d each are positive numbers.

In one embodiment, 100 pixel driving circuits 31 may correspond to a same repair connection line 14, 46 pixel driving circuits 31 are disposed on one side of the overlapping portion 151 of the repair connection line 14 and the inter-row connection line 15, and 54 pixel driving circuits 31 are disposed on the other side of the overlapping portion 151 of the repair connection line 14 and the inter-row connection line 15. That is, K=100, c=46, and d=54. In an actual display panel, due to different sizes of different display panels, the quantity of pixel driving circuits 31 in a corresponding pixel driving circuit row 310 may be different. Accordingly, the values of K, c, and d may have other values according to actual situations.

The pixel driving circuits 31 corresponding to a repair connection line 14 may be disposed on two sides of the overlapping portion 151 of the repair connection line 14 and the inter-row connection line 15. As such, the situation may be avoided, where the pixel driving circuit 31 to be repaired is too far away from the corresponding repair driving circuit 20, resulting in display delay.

In some embodiments, $|c-d|\leq 10$. That is, the quantities of corresponding pixel driving circuits 31 provided on two sides of the overlapping portion 151 of the repair connection line 14 and the inter-row connection line 15 are approximately equal. As such, the situation may be avoided, where the pixel driving circuit 31 to be repaired is too far away from the corresponding repair driving circuit 20, resulting in display delay.

It should be noted that in an actual display panel, one pixel circuit driving row may include hundreds or thousands of pixel driving circuits. For example, in existing technology, a display panel may have a resolution of 3456*2160. It may be roughly understood that the display panel includes 3456 pixel circuit driving rows, and each pixel circuit driving row includes 2160 pixel driving circuits. Even if there are 10 repair driving circuits and 10 repair connection lines in one pixel driving circuit row, approximately 200 pixel driving circuits are needed for each repair connection line. In this case, when the difference in the quantities of pixel driving circuits correspondingly provided on two sides of the overlapping portion 151 of the repair connection line 14 and the inter-row connection line 15 is less than 10, the quantities of the pixel driving circuits correspondingly provided on two sides of the overlapping portion 151 of the repair connection line 14 and the inter-row connection line 15 may be considered to be approximately equal.

In a more specific embodiment, $|c-d|\leq 1$. The quantities of pixel driving circuits provided on two sides of the overlapping portion 151 of the repair connection line 14 and the inter-row connection line 15 are set to be same as much as possible. The situation may be avoided, where the pixel driving circuit to be repaired is too far away from the corresponding repair driving circuit, causing display delay.

Specifically, c and d are not necessarily integers. The overlapping portion 151 of the repair connection line 14 and the inter-row connection line 15 may overlap with the pixel driving circuits 31 in the second direction h2. In this case, c and d do not need to be integers.

Figure 27:
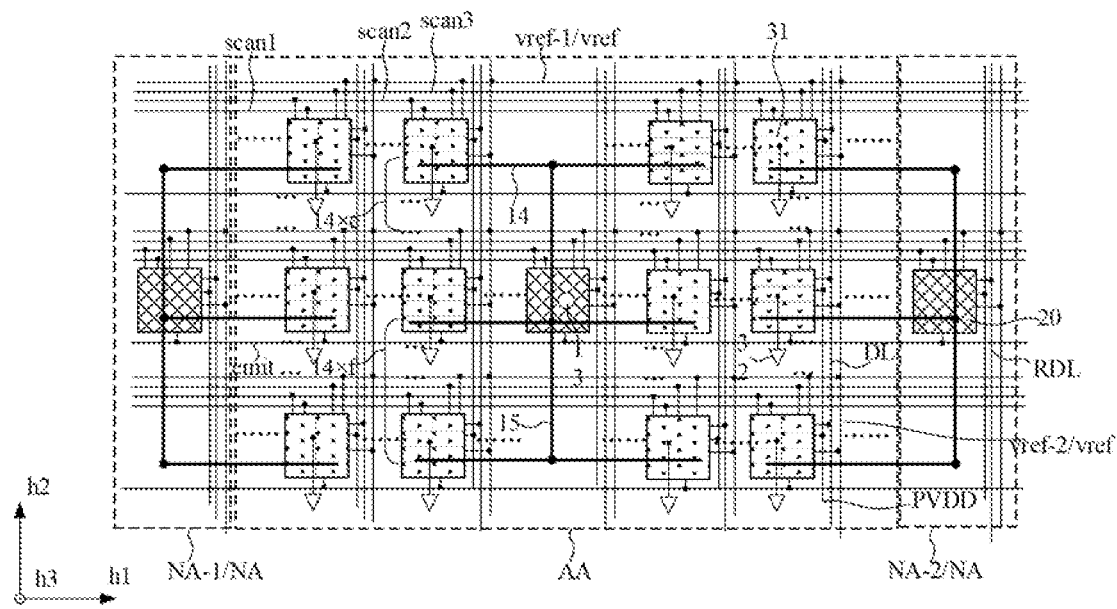
FIG. 27 illustrates a partial schematic diagram of another display panel consistent with the disclosed embodiments of the present disclosure.

FIG. 27 illustrates a partial schematic diagram of another display panel. In some embodiments, as shown in FIG. 2 and FIG. 27, the repair driving circuit may include the driving transistor T3. As shown in FIG. 27, along the second direction h2, the inter-row connection line 15 may overlap with the repair driving circuit 20. One inter-row connection line 15 may be electrically connected to Y pieces of repair connection lines 14. In the second direction h2, e pieces of repair connection lines 14 are disposed on one side of the driving transistor T3 of the repair driving circuit 20, and f pieces of repair connection lines 14 are disposed on the other side of the driving transistor M3, where Y=e+f, $|e-f|\leq 5$, and Y, e, f each are positive integers.

In one embodiment, one inter-row connection line 15 is electrically connected to 20 repair connection lines 14. Twelve repair connection lines 14 are disposed on one side of the driving transistor T3 of the repair driving circuit 20, and eight repair connection lines 14 are disposed on the other side of the driving transistor T3 of the repair driving circuit 20. That is Y=20, e=12, and f=8. In an actual display panel, due to different sizes of different display panels, other values for Y, e, and f may be selected according to actual situations.

By setting $|e-f|\leq 5$, the quantities of the repair connection lines 14 correspondingly provided on two sides of the repair driving circuit 20 in the second direction h2 are approximately equal. The repair driving circuit 20 may be disposed in the middle of the corresponding plurality of pixel driving circuits 31 as much as possible. The situation may be avoided, where the pixel driving circuit 31 to be repaired is too far away from the corresponding repair driving circuit 20, resulting in display delay. In a more specific embodiment, $|e-f|\leq 2$.

It should be noted that since the repair connection line 14 may have an overlapping relationship with the entire repair driving circuit 20, the driving transistor T3 may be used as a reference to determine the position of the repair connection line 14.

It should be noted that in an actual display panel, one pixel circuit driving row may include hundreds or thousands of pixel driving circuits. For example, in existing technology, a display panel may have a resolution of 3456*2160. It may be roughly understood that the display panel includes 3456 pixel circuit driving rows, and each pixel circuit driving row includes 2160 pixel driving circuits. In this case, when the difference in the quantities of repair connection lines 14 correspondingly provided on two sides of the repair driving circuit 20 in the second direction h2 is less than 5, the repair connection lines 14 correspondingly provided on two sides of the repair driving circuit 20 in the second direction h2 may be considered to be approximately equal.

Figure 28:
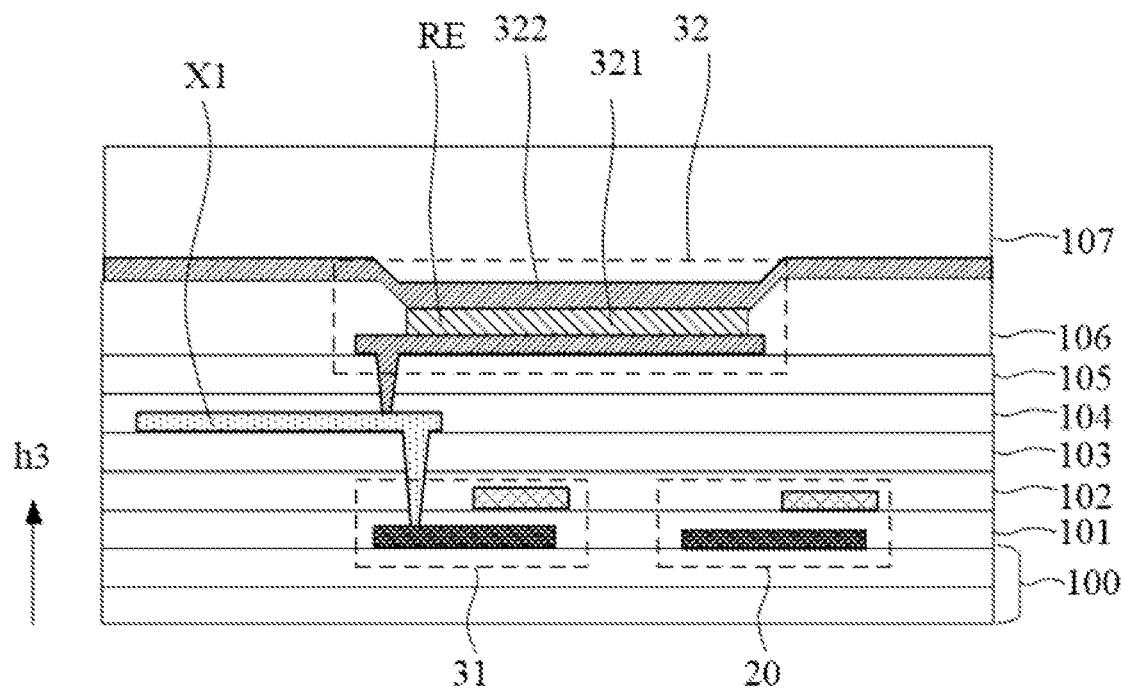
FIG. 28 illustrates a partial cross-sectional schematic diagram of another display panel consistent with the disclosed embodiments of the present disclosure.
Figure 29:
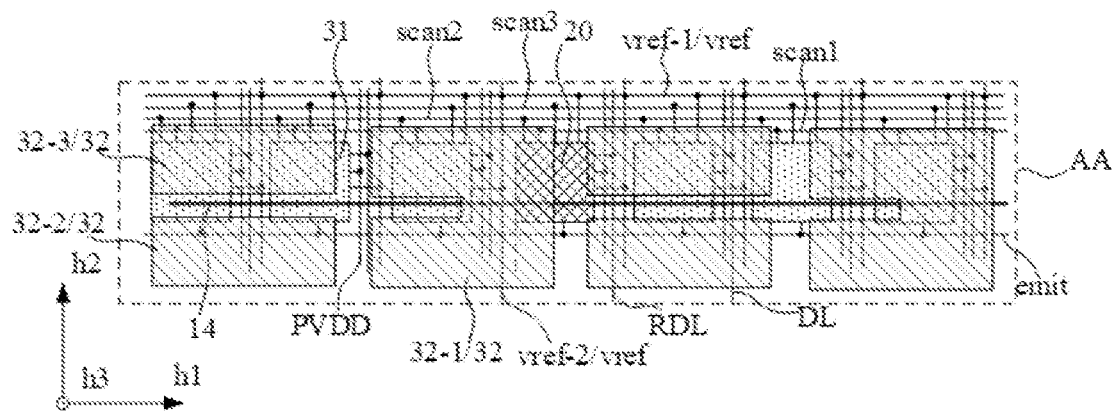
FIG. 29 illustrates a partial schematic diagram of another display panel consistent with the disclosed embodiments of the present disclosure.

FIG. 28 illustrates a partial cross-sectional schematic diagram of another display panel. FIG. 29 illustrates a partial schematic diagram of another display panel. FIG. 29 shows the pixel driving circuit 31 and the repair driving circuit 20 in a simplified way, and specific circuit structures may be referred to FIG. 2. In some embodiments, as shown in FIGS. 28 and 29, along the direction h3 perpendicular to the plane of the substrate 100, one repair driving circuit 20 at least partially overlaps with at least one light-emitting element 32.

In one embodiment, the repair driving circuit 20 is disposed on the driving circuit layer and does not have a light-emitting element directly correspondingly disposed. The light-emitting elements 32 may be disposed over the repair driving circuit 20, as shown in FIG. 29. Accordingly, the aperture ratio of the display panel may be increased, and the display effect may be improved.

Specifically, as shown in FIG. 28, the display panel also includes a light-emitting material layer 321 and a cathode metal layer 322. After the light-emitting material layer 321 is in contact with the anode metal layer RE and the cathode metal layer 322, the light-emitting material layer 321 may emit light through the current provided by the anode metal layer RE and the cathode metal layer 322. The light-emitting material layer 321, the anode metal layer RE and the cathode metal layer 322 together form the light-emitting element 32. The display panel also includes a sixth insulating layer 106 and an encapsulation layer 107. The sixth insulating layer 106 is disposed on a side of the anode metal layer RE away from the substrate 100. The sixth insulating layer 106 is configured to define the light-emitting area of the pixel. The encapsulation layer 107 is disposed on a side of the cathode metal layer 322 away from the substrate 100. In some embodiments, the sixth insulating layer 106 includes an organic insulating material, such as acrylic resin, epoxy resin, phenolic resin, polyamide resin, polyimide resin, or a combination thereof. In some implementations, the sixth insulating layer 106 may include a plurality of organic layers. The encapsulation layer 107 may include at least one inorganic encapsulation layer and at least one organic layer. When the encapsulation layer 107 includes a plurality of stacked encapsulation layers, and the encapsulation layer closest to the display film layer is an inorganic encapsulation layer, blocking water and oxygen.

Specifically, as shown in FIG. 29, the display panel includes a first light-emitting element 32-1, a second light-emitting element 32-2, and a third light-emitting element 32-3. The first light-emitting element 32-1, the second light-emitting element 32-2 and the third light-emitting element 32-3 are blue, green and red light-emitting elements respectively, together forming a display pixel.

It should be noted that in FIG. 29, the pixel driving circuit 31 also at least partially overlaps the light-emitting element 32 in the h3 direction. However, the overlapping portion of the pixel driving circuit 31 and the light-emitting element 32 does not include the overlapping portion of the pixel driving circuit 31 (specifically, the first transfer structure X1 shown in FIG. 2) and the repair connection line 14. Accordingly, during pixel repair, failure to electrically connect the light-emitting element 32 in the pixel driving circuit 31 and the repair connection line 14 may be avoided.

Optionally, in FIGS. 28 and 29, the repair driving circuit 20 and a light-emitting element 32 at least partially overlap in the h3 direction. In an actual display panel, one repair driving circuit 20 may at least partially overlap with a plurality of light-emitting elements 32 in the h3 direction simultaneously.

In some embodiments, as shown in FIG. 29, in the direction h3 perpendicular to the plane of the substrate 100, the at least one light-emitting element 32-1 overlapping with the repair driving circuit 20 includes a blue light-emitting element.

Specifically, the display panel includes a plurality of blue pixels, red pixels and green pixels. Each pixel emits light through a corresponding blue light-emitting element, a red light-emitting element, and a green light-emitting element. The area of each pixel may be set according to the light-emitting efficiency or material life of the light-emitting material of the light-emitting element. For example, when the light-emitting material has a higher light-emitting efficiency or longer material lifetime, the area of the sub-pixel may be smaller. When the light-emitting material has a lower light-emitting efficiency or shorter material lifetime, the area of the sub-pixel may be larger.

The light-emitting efficiency and material life of red light-emitting materials and green light-emitting materials are higher than the light-emitting efficiency of blue light-emitting materials. As such, a projected area of the blue light-emitting element may be larger than projected areas of the red light-emitting element and the green light-emitting element. As a result, the repair driving circuit 20 may overlap with the blue light-emitting element in the h3 direction.

Figure 30:
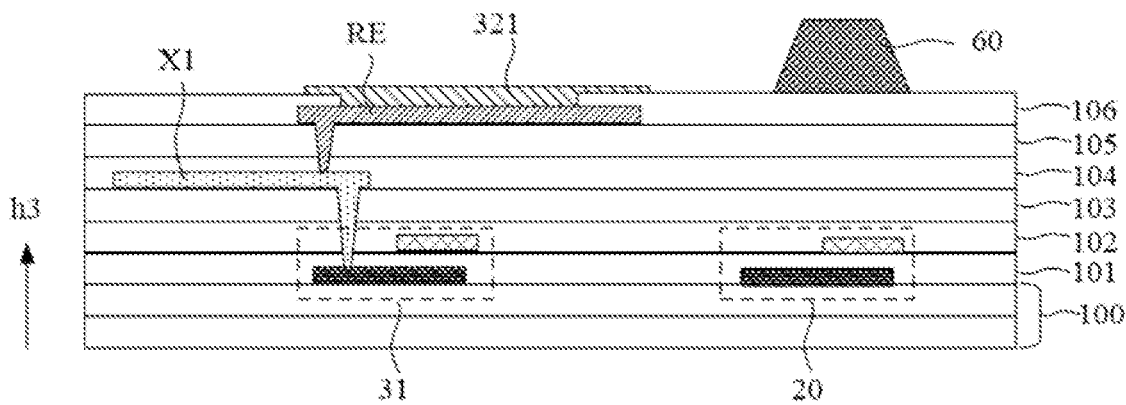
FIG. 30 illustrates a partial cross-sectional schematic diagram of another display panel consistent with the disclosed embodiments of the present disclosure.
Figure 31:
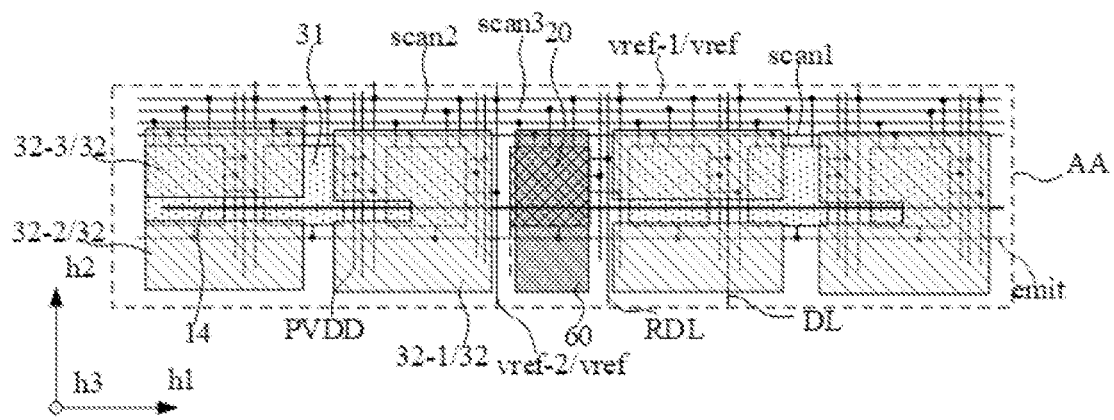
FIG. 31 illustrates a partial schematic diagram of another display panel consistent with the disclosed embodiments of the present disclosure.

FIG. 30 illustrates a partial cross-sectional schematic diagram of another display panel. FIG. 31 illustrates a partial schematic diagram of another display panel. FIG. 31 shows the pixel driving circuit 31 and the repair driving circuit 20 in a simplified way, and specific circuit structures may be referred to FIG. 2. FIG. 30 only illustrates a support pillar structure 60 and part of the film layers on a side of the support pillar structure 60 close to the substrate 100. A cathode metal layer 322 and an encapsulation layer 107 are also provided on a side of the support pillar structure 60 away from the substrate 100. Details are not shown in FIG. 30, and reference may be made to FIG. 28. In some embodiments, as shown in FIGS. 30 and 31, the display panel also includes a support column structure 60. Along the direction h3 perpendicular to the plane of the substrate 100, the support pillar structure 60 at least partially overlaps with the repair driving circuit 20.

As shown in FIG. 30, the support pillar structure 60 is disposed on the side of the sixth insulating layer 106 away from the substrate 100 and is disposed in the non-light-emitting area between the light-emitting elements 32 to prevent scratching during a mask process. It may be understood that the support pillar structure 60 may protect the light-emitting material layer 321 when pressure is applied to the display device. The support pillar structure 60 includes an organic insulating material, such as polyimide. The support pillar structure 60 may include a different material from the sixth insulating layer 106, or may include a same material as the sixth insulating layer 106. When the support pillar structure 60 and the sixth insulating layer 106 include a same material, the sixth insulating layer 106 and the support pillar structure 60 may be formed together in a mask process using a half-tone mask. Since the repair driving circuit 20 is disposed on the driving circuit layer and does not have a light-emitting element directly correspondingly disposed, the supporting structure 60 may be provided over the repair driving circuit 20, as shown in FIG. 31. Accordingly, the quantity or area of the supporting structures 60 may be increased, the supporting effect may be improved, and the production yield and display effect of the display panel may be improved.

Figure 32:
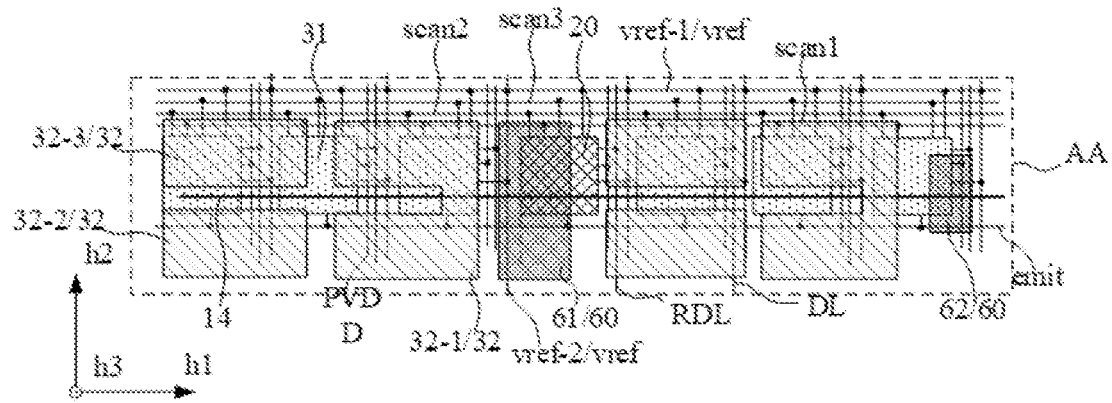
FIG. 32 illustrates a partial schematic diagram of another display panel consistent with the disclosed embodiments of the present disclosure.

FIG. 32 illustrates a partial schematic diagram of another display panel. FIG. 32 shows the pixel driving circuit 31 and the repair driving circuit 20 in a simplified way, and specific circuit structures may be referred to FIG. 2. In some embodiments, as shown in FIG. 32, the support pillar structure 60 includes a first support pillar 61 and a second support pillar 62. Along the direction h3 perpendicular to the plane of the substrate 100, the projected area of the first support pillar 61 may be larger than the projected area of the second support pillar 62. Specifically, the projected area of the first support pillar 61 is A1, and the projected area of the second support pillar 62 is A2, where A1>n*A2, and n is a positive number. Along the direction h3 perpendicular to the plane of the substrate 100, the first support pillar 62 overlaps with the repair driving circuit 20.

Specifically, the support pillar structures 60 may be disposed at the spacing between the light-emitting elements in the display panel, and support pillar structures 60 of different sizes may be provided in the display panel. When the repair driving circuit 20 is disposed in the display area, there may be a large space over the repair driving circuit 20 for disposing the support pillar structure 60. As such, the first support pillar 61 with a larger area may be disposed at least partially overlapping with the repair driving circuit 20. That is to say, the drive circuit layer under the support pillar structure 61 with a larger projected area is more convenient for installing the repair driving circuit 20. Accordingly, the support effect may be improved, and the production yield and display effect of the display panel may be improved.

In some embodiments, along the direction h3 perpendicular to the plane of the substrate 100, the projected areas of the pixel driving circuit 31 and the repair driving circuit 20 may be same.

Specifically, when the repair driving circuit 20 and the pixel driving circuit 31 have a same circuit structure, the repair driving circuit 20 may be used to drive the light-emitting element 32 to emit light. In this case, the projected areas of the pixel driving circuit 31 and the repair driving circuit 20 are same. Accordingly, the circuit layout in the driving circuit layer may be simplified, and the production of the display panel may become easier.

Figure 33:
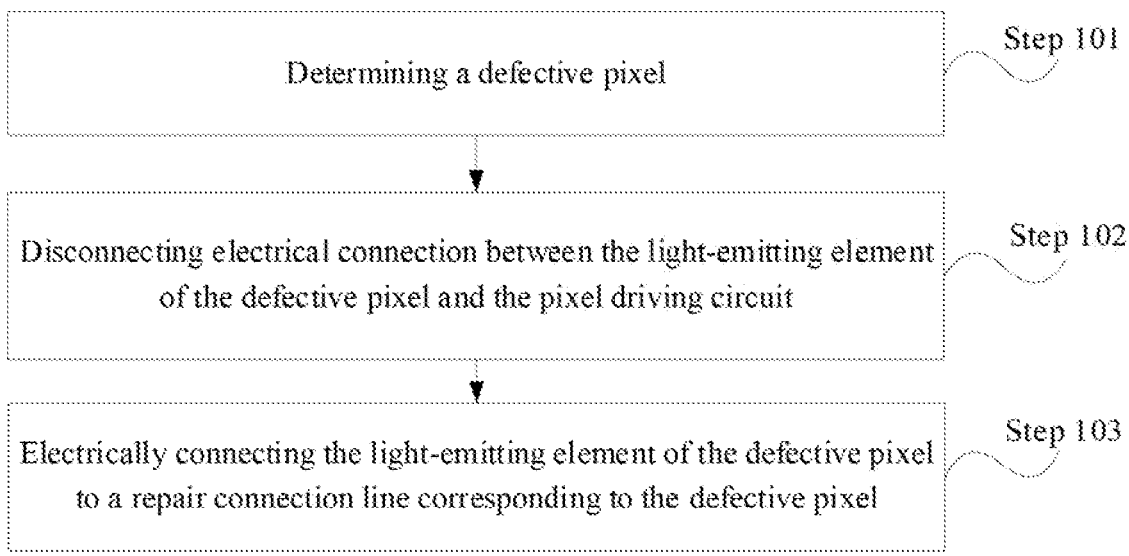
FIG. 33 illustrates a schematic flowchart of a pixel repair method for a display panel consistent with the disclosed embodiments of the present disclosure.

The present disclosure also provides a pixel repair method for a display panel. The method may be used for the display panel provided by the present disclosure. FIG. 33 illustrates a schematic flowchart of a pixel repair method for a display panel consistent with the disclosed embodiments of the present disclosure. As shown in FIG. 33, the method includes Steps 101-103.

Step 101: determining a defective pixel. Specifically, a light-emitting element with abnormal light emission may be first determined, and then the pixel corresponding to the light-emitting element may be determined as the defective pixel.

Figure 34:
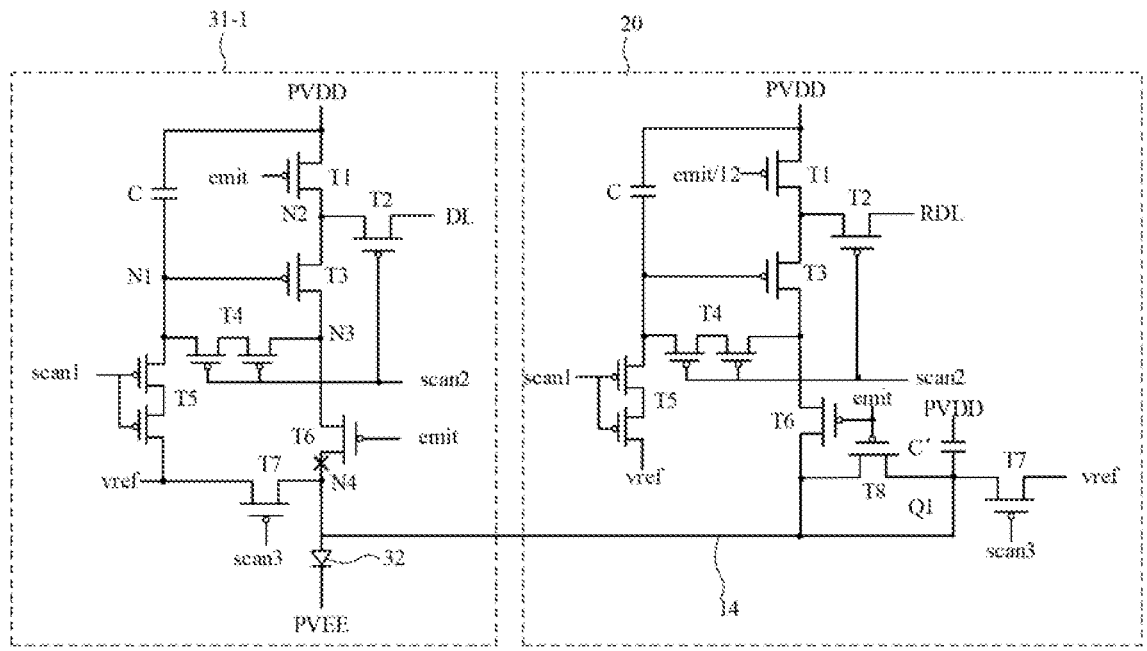
FIG. 34 illustrates a schematic circuit diagram of another display panel consistent with the disclosed embodiments of the present disclosure.

Step 102: disconnecting electrical connection between the light-emitting element of the defective pixel and the pixel driving circuit. Specifically, as shown in FIG. 14, when a pixel driving circuit 31-1 in the display panel fails, the light-emitting element 32-1 corresponding to the pixel driving circuit 31-1 may fail to emit light normally. In this case, it is necessary to use the repair connection line 14-1 and the repair driving circuit 20-1 corresponding to the pixel driving circuit 31-1 to drive the light-emitting element 32-1 to emit light. As shown in FIG. 14, when the pixel driving circuit 31-1 fails, the electrical connection between the light-emitting element 32-1 and the pixel driving circuit 31-1 needs to be cut off first. FIG. 34 illustrates a schematic circuit diagram of another display panel. Specifically, as shown in FIG. 34, it is necessary to cut off the electrical connection between the light-emitting element 32 and the second light-emitting control transistor T6. The electrical connection between the light-emitting element 32 and the second reset transistor T7 may be retained, and the process flow may thus be simplified during pixel repair. Disconnecting the electrical connection between two components in the display panel may be performed by laser fusing.

Step 103: electrically connecting the light-emitting element of the defective pixel to a repair connection line corresponding to the defective pixel. Specifically, as shown in FIG. 2, Step 103 specifically includes welding the overlapping portion between the repair connection line 14 and the first transfer structure X1. Since the first transfer structure X1 is electrically connected to the anode RE of the light-emitting element 32, the repair connection line 14 may be electrically connected to the anode RE of the light-emitting element 32 through the first transfer structure X1. The electrical connection between two components in the display panel may be implemented by laser welding.

In a more specific embodiment, the method also includes Step 104: electrically connecting the light-emitting element of the defective pixel to the corresponding repair driving circuit and the corresponding repair connection line.

As shown in FIGS. 2 and 14, when the repair driving circuit 20-1 participates in pixel repair, in addition to electrically connecting the light-emitting element 32-1 to the repair connection line 14, the repair driving circuit 20-1 also needs to be electrically connected to the repair connection line 14. That is, it is also necessary to weld the overlapping portions of the second transfer structure X2 and the third transfer structure X3 with the repair connection line 14. In one embodiment, the second transfer structure X2 is already electrically connected to the repair connection line 14. In this case, only the overlapping portion of the third transfer structure X3 and the repair connection line 14 needs to be welded.

Before the repair driving circuit 20 participates in pixel repair, the circuit schematic diagram of the repair driving circuit 20 and the pixel driving circuit 31 is shown in FIG. 3. Referring to FIGS. 2 and 3, a second parasitic capacitance Q2 may be formed at the overlapping portion of the repair connection line 14 and the first transfer structure X1, and a first parasitic capacitance Q1 may be formed at the overlapping portion of the repair connection line 14 and the third transfer structure X3. The circuit principle diagram when the repair driving circuit 20 participates in pixel repair is shown in FIG. 34. Positions corresponding to the first parasitic capacitance Q1 and the second parasitic capacitance Q2 are welded into wires.

Moreover, when the repair driving circuit 20 does not participate in pixel repair, in phases other than the light-emitting phase, the repair control transistor T8 may be used to avoid repeatedly writing the reference voltage provided by the lateral reset voltage line vref−1 into the parasitic capacitance on the repair connection line 14. That is, the repair control transistor T8 may not participate in pixel repair. After the first parasitic capacitor Q1 is welded into a wire, the repair control transistor T8 may be short-circuited, such that the repair control transistor T8 does not participate in pixel repair.

The method provided by the present disclosure may be applied to the display panels provided by the present disclosure, and may have beneficial effects of the corresponding display panels, which will not be elaborated here.

The present disclosure also provides a display device. The display device includes the display panel provided by the present disclosure.

Figure 35:
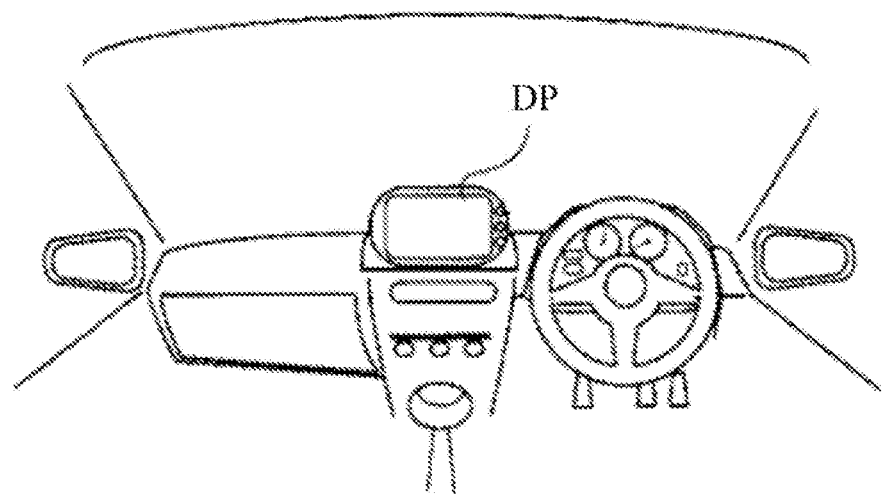
FIG. 35 illustrates a schematic structural diagram of a display device consistent with the disclosed embodiments of the present disclosure.

The display device may be, for example, a mobile phone, a tablet computer, a notebook computer, an electronic paper book, a television, a smart watch, or any other device with a display function. FIG. 35 illustrates a schematic structural diagram of a display device consistent with the disclosed embodiments of the present disclosure. As shown in FIG. 35, the display device includes a display panel DP provided by the present disclosure. When the display panel is used in a vehicle such as a car, a ship or an airplane as a carrier display, the display panel may be independent of the inherent structure in the vehicle, or the display panel may be a part of the vehicle, integrated with other structural components of the vehicle. For example, the display panel may be integrated with the front windshield or integrated with the tabletop around the instrument panel. The present disclosure does not limit any specific application of the display panel.

Specifically, the display device may be a medium-sized display device such as a tablet computer, a notebook computer, or a vehicle-mounted display screen. In existing technology, the repair connection line may extend from the non-display area on one side of the display panel to the non-display area on the other side of the display panel, introducing a large parasitic capacitance on the repair connection line. When it is necessary to reset the light-emitting element connected to the repair connection line, due to the large width of the display panel of medium-sized products, the parasitic capacitance on the repair connection line may be large. That is, there is a large amount of charge on the repair connection line. Since the reset time is limited, writing of the reset voltage signal on the reset voltage line may be insufficient, and the reset voltage signal may not be fully written to the anode of the corresponding light-emitting element. As a result, the operation voltage of the anode of the light-emitting element may not be sufficiently written during the light-emitting phase, resulting in abnormal display.

By disposing at least two repair connection lines corresponding to one pixel driving circuit row, the display device provided by the present disclosure may avoid the repair connection lines penetrating the display panel. Each repair connection line may be shortened, and the quantity of pixel driving circuits overlapping with the repair connection line and the quantity of signal lines extending along the second direction may be reduced. Accordingly, the parasitic capacitance on the repair connection line may be reduced. As such, when resetting the anode of the light-emitting element before emitting light, the reset voltage signal on the reset voltage line may be fully written. The anode of the light-emitting element may be fully written with the corresponding reset voltage signal and the operation voltage of the subsequent light-emitting stage. As a result, the light-emitting element driven by the repair driving circuit may emit light normally.

The display device provided by the present disclosure includes the display panel provided by the present disclosure, and may have the beneficial effects of the display panel, which will not be described again here.

As disclosed, the technical solutions of the present disclosure have the following advantages.

In the display panel provided by the present disclosure, by disposing a plurality of repair connection lines corresponding to one pixel driving circuit row, each repair connection line may be shortened, and the parasitic capacitance on the repair connection line may be reduced. Accordingly, the repair driving circuit may drive the light-emitting element to emit light normally.

It should be noted that in the present disclosure, relational terms such as "first" and "second" are only used to distinguish one entity or operation from another entity or operation, and do not necessarily require or imply that such actual relationship or sequence exists between these entities or operations. The terms "comprise" or "include" or any other variation thereof are intended to cover a non-exclusive inclusion. A process, method, article, or apparatus that includes a list of elements includes not only the list of elements, but also other elements not expressly listed, or elements inherent to such process, method, article, or apparatus. Without further limitation, an element defined by a statement like "comprises a . . . " does not exclude the presence of additional identical elements in a process, method, article, or device that includes the foregoing element.

The embodiments disclosed herein are exemplary only and not limiting the scope of the present disclosure. Various combinations, alternations, modifications, equivalents, or improvements to the technical solutions of the disclosed embodiments may be obvious to those skilled in the art. Without departing from the spirit and scope of this disclosure, such combinations, alternations, modifications, equivalents, or improvements to the disclosed embodiments are encompassed within the scope of the present disclosure.

What is claimed is:

1. A display panel, comprising:
a substrate and a display area, wherein the display area includes a plurality of pixel driving circuit rows and a plurality of light-emitting elements, a pixel driving circuit row of the plurality of pixel driving circuit rows includes a plurality of pixel driving circuits, and a pixel driving circuit of the plurality of pixel driving circuits is electrically connected to at least one light-emitting element of the plurality of light-emitting elements;
a plurality of repair driving circuits and a plurality of repair connection lines, wherein a repair connection line of the plurality of repair connection lines extends along a first direction, and along a direction perpendicular to a plane of the substrate, a repair driving circuit of the plurality of repair driving circuits at least partially overlaps with the repair connection line; and
a support pillar structure,
wherein:
along the first direction, the pixel driving circuit row is correspondingly disposed with at least two repair connection lines of the plurality of repair connection lines;
along the direction perpendicular to the plane of the substrate, the pixel driving circuit row at least partially overlaps with the at least two repair connection lines; and
along the direction perpendicular to the plane of the substrate, the support pillar structure at least partially overlaps with the repair driving circuit.

2. The display panel according to claim 1, wherein:
along the first direction, a sum of lengths of the at least two repair connection lines corresponding to a same pixel driving circuit row of the plurality of the pixel driving circuit rows is less a length of the same pixel driving circuit row.

3. The display panel according to claim 1, further comprising a non-display area, wherein:
the non-display area at least partially surrounds the display area, the non-display area includes the repair driving circuit, and the repair driving circuit is disposed on two sides of the display area along the first direction; and
along the first direction, the pixel driving circuit row is correspondingly disposed with two repair connection lines of the plurality of the repair connection lines, and includes X pieces of the pixel driving circuits, n pieces of the pixel driving circuits are correspondingly disposed with one repair connection line of the two repair connection lines, and m pieces of the pixel driving circuits are correspondingly disposed with another repair connection line of the two repair connection lines, wherein n, m, and X each are positive integers, and n+m=X.

4. The display panel according to claim 3, wherein: $|n-m|\leq 10$.

5. The display panel according to claim 3, wherein:
the non-display area further includes a dummy pixel driving circuit; and
the dummy pixel driving circuit is disposed on a side of the repair driving circuit away from the display area.

6. The display panel according to claim 1, wherein:
the repair driving circuit is disposed in the pixel driving circuit row.

7. The display panel according to claim 6, wherein:
the pixel driving circuit row includes at least two repair driving circuits of the plurality of repair driving circuits; and
along the first direction, in a same pixel driving circuit row of the plurality of pixel driving circuit rows, among P pieces of the pixel driving circuits corresponding to a same repair connection line of the plurality of repair connection line, a pieces of the pixel driving circuits are disposed on one side of a repair driving circuit of the at least two repair driving circuits, and b pieces of the pixel driving circuits are disposed on another side of the repair driving circuit, wherein P=a+b, and P, a, and b are each positive integers.

8. The display panel according to claim 7, wherein: $|a-b|\leq 10$.

9. The display panel according to claim 7, wherein:
the at least two repair connection lines are correspondingly provided with a same quantity of the pixel driving circuits.

10. The display panel according to claim 1, further comprising an inter-row connection line, wherein:
the inter-row connection line extends along a second direction, wherein the first direction and the second direction intersect; and
the inter-row connection line is electrically connected to at least two repair connection lines arranged in the second direction, of the plurality of repair connection lines.

11. The display panel according to claim 10, wherein:
the at least two repair connection lines arranged in the second direction include a first repair connection line and at least one second repair connection line, and the inter-row connection line is electrically connected to the first repair connection line and the at least one second repair connection line;

along the direction perpendicular to the plane of the substrate, the first repair connection line at least partially overlaps with the repair driving circuit; and
the at least one second repair connection line is disposed with g pieces of the pixel driving circuits, and the first repair connection line is disposed with k pieces of the pixel driving circuits, wherein g<k, and g and k each are positive integers.

12. The display panel according to claim 10, wherein:
along the second direction, the inter-row connection line at least partially overlaps with the repair driving circuit.

13. The display panel according to claim 12, wherein:
among K pieces of the pixel driving circuits corresponding to a same repair connection line, c pieces of the pixel driving circuits are disposed on one side of an overlapping portion of the repair connection line and the inter-row connection line, d pieces of the pixel driving circuits are disposed on another side of the overlapping portion of the repair connection line and the inter-row connection line, wherein K=c+d, $|c-d|\leq 10$, and K, c, and d each are positive numbers.

14. The display panel according to claim 12, wherein:
the repair driving circuit includes a driving transistor; and
one of the inter-row connection line is electrically connected to Y pieces of the repair connection lines and at least partially overlaps with the repair driving circuit, and in the second direction, e pieces of the repair connection lines are disposed on one side of the driving transistor of the repair driving circuit, and f pieces of the repair connection lines are disposed on another side of the driving transistor, wherein Y=e+f, $|e-f|\leq 5$, and Y, e, f each are positive integers.

15. The display panel according to claim 1, further comprising a driving circuit layer, wherein:
the driving circuit layer includes the pixel driving circuit and the repair driving circuit, and the light-emitting element is disposed on a side of the driving circuit layer away from the substrate.

16. The display panel according to claim 15, wherein:
along the direction perpendicular to the plane of the substrate, one of the repair driving circuits at least partially overlaps with at least one of the light-emitting elements.

17. The display panel according to claim 16, wherein:
in the direction perpendicular to the plane of the substrate, at least one of the light-emitting elements at least partially overlapping with the repair driving circuit includes a blue light-emitting element.

18. The display panel according to claim 15, further comprising an anode metal layer disposed on a side of the driving circuit layer away from the substrate, wherein:
an anode of the light-emitting element is disposed on the anode metal layer;
the driving circuit layer further includes a capacitor metal layer and a first transfer structure, at least part of the repair connection lines is disposed in the capacitor metal layer, and the first transfer structure is located on a side of the capacitor metal layer away from the substrate; and
the first transfer structure is electrically connected to the anode of the light-emitting element, and along the direction perpendicular to the plane of the substrate, the repair connection line at least partially overlaps with the first transfer structure.

19. The display panel according to claim 18, further comprising an inter-row connection line, wherein:

the inter-row connection line extends along a second direction, wherein the first direction and the second direction intersect;
the inter-row connection line is electrically connected to at least two repair connection lines arranged in the second direction, of the plurality of repair connection lines; and
the driving circuit layer further includes a wiring metal layer, wherein the wiring metal layer is disposed on a side of the capacitor metal layer away from the substrate, at least part of the repair connection lines is located on the capacitor metal layer, and at least part of the inter-row connection lines is located on the wiring metal layer.

20. The display panel according to claim 15, further comprising a plurality of data lines, wherein:
the pixel driving circuit and the repair driving circuit are electrically connected to different data lines of the plurality of data lines respectively; and
the driving circuit layer further includes at least one wiring metal layer, and the data lines are disposed on a same wiring metal layer of the at least one wiring metal layer.

21. The display panel according to claim 1, wherein:
the support pillar structure includes a first support pillar and a second support pillar, and along the direction perpendicular to the plane of the substrate, a projected area of the first support pillar is larger than a projected area of the second support pillar; and
along the direction perpendicular to the plane of the substrate, the first support pillar overlaps with the repair driving circuit.

22. The display panel according to claim 1, wherein:
along the direction perpendicular to the plane of the substrate, projected areas of the pixel driving circuit and the repair driving circuit are approximately same.

23. The display panel according to claim 1, further comprising a light-emitting control line, a power supply voltage line, a first scan line, a second scan line, a third scan line, a repair data line, a first reset voltage line, and a second reset voltage line, wherein:
the repair driving circuit includes a driving transistor, a data writing transistor, a first reset transistor, a second reset transistor, a threshold compensation transistor, a first light-emitting control transistor, a second light-emitting control transistor, and a first storage capacitor;
a first electrode of the first light-emitting control transistor is electrically connected to the power supply voltage line, a second electrode of the first light-emitting control transistor is electrically connected to a first electrode of the driving transistor, and a gate of the first light-emitting control transistor is electrically connected to the light-emitting control line;
a first electrode of the first reset transistor is electrically connected to the reset voltage line, a second electrode of the first reset transistor is electrically connected to a gate of the driving transistor, and a gate of the first reset transistor is electrically connected to the first scan line;
a first electrode of the threshold compensation transistor is electrically connected to a second electrode of the driving transistor, a second electrode of the threshold compensation transistor is electrically connected to the gate of the driving transistor, and a gate of the threshold compensation transistor is electrically connected to the second scan line;
a first electrode of the data writing transistor is electrically connected to the repair data line, a second electrode of the data writing transistor is electrically connected to the first electrode of the driving transistor, and a gate of the data writing transistor is electrically connected to the second scanning line;
a first plate of the first storage capacitor is electrically connected to the power supply voltage line, and a second plate of the first storage capacitor is electrically connected to the gate of the driving transistor;
a first electrode of the second light-emitting control transistor is electrically connected to the second electrode of the driving transistor, a gate of the second light-emitting control transistor is electrically connected to the light-emitting control line emit, and a second electrode of the second light-emitting control transistor is located on an active layer and is electrically connected to a second transfer structure, wherein the second transfer structure is located on a side of the active layer away from the substrate, and along the direction perpendicular to the plane of the substrate, the second transfer structure at least partially overlaps with the repair connection line; and
a first electrode of the second reset transistor is electrically connected to the second reset voltage line, a gate of the second reset transistor is electrically connected to the third scan line, a second electrode of the second reset transistor is located on the active layer and is electrically connected to a third transfer structure, wherein the third transfer structure is located on a side of the active layer away from the substrate, and along the direction perpendicular to the plane of the substrate, the third transfer structure at least partially overlaps with the repair connection line.

24. The display panel according to claim 23, wherein:
the first reset voltage line is electrically connected to the second reset voltage line; or
the first reset voltage line is multiplexed as the second reset voltage line.

25. The display panel according to claim 23, wherein:
the second transfer structure is electrically connected to the repair connection line.

26. The display panel according to claim 23, wherein:
the repair driving circuit further includes a second storage capacitor, wherein a first plate of the second storage capacitor is electrically connected to the second electrode of the second reset transistor, and a second plate of the second storage capacitor is electrically connected to the power supply voltage line.

27. The display panel according to claim 23, wherein:
the repair driving circuit further includes a repair control transistor, wherein a first electrode of the repair control transistor is electrically connected to the second electrode of the second reset transistor, a second electrode of the repair control transistor is electrically connected to the repair connection line, and a gate of the repair control transistor is electrically connected to the light-emitting control line.

28. A pixel repair method for a display panel, wherein:
the display panel includes:
a substrate and a display area, wherein the display area includes a plurality of pixel driving circuit rows and a plurality of light-emitting elements, a pixel driving circuit row of the plurality of pixel driving circuit rows includes a plurality of pixel driving circuits, and a pixel driving circuit of the plurality of pixel driving circuits is electrically connected to at least one light-emitting element of the plurality of light-emitting elements;

a plurality of repair driving circuits and a plurality of repair connection lines; and a support pillar structure, wherein a repair connection line of the plurality of repair connection lines extends along a first direction, along a direction perpendicular to a plane of the substrate, a repair driving circuit of the plurality of repair driving circuits at least partially overlaps with the repair connection line, along the first direction, the pixel driving circuit row is correspondingly disposed with at least two repair connection lines of the plurality of repair connection lines, along the direction perpendicular to the plane of the substrate, the pixel driving circuit row at least partially overlaps with the at least two repair connection lines, and, and along the direction perpendicular to the plane of the substrate, the support pillar structure at least partially overlaps with the repair driving circuit; and the method includes:

determining a defective pixel;

disconnecting electrical connection between the light-emitting element of the defective pixel and the pixel driving circuit; and electrically connecting the light-emitting element of the defective pixel to a repair connection line corresponding to the defective pixel.

29. A display device, comprising a display panel including:

a substrate and a display area, wherein the display area includes a plurality of pixel driving circuit rows and a plurality of light-emitting elements, a pixel driving circuit row of the plurality of pixel driving circuit rows includes a plurality of pixel driving circuits, and a pixel driving circuit of the plurality of pixel driving circuits is electrically connected to at least one light-emitting element of the plurality of light-emitting elements;

a plurality of repair driving circuits and a plurality of repair connection lines, wherein a repair connection line of the plurality of repair connection lines extends along a first direction, and along a direction perpendicular to a plane of the substrate, a repair driving circuit of the plurality of repair driving circuits at least partially overlaps with the repair connection line; and a support pillar structure, wherein:

along the first direction, the pixel driving circuit row is correspondingly disposed with at least two repair connection lines of the plurality of repair connection lines;

along the direction perpendicular to the plane of the substrate, the pixel driving circuit row at least partially overlaps with the at least two repair connection lines; and along the direction perpendicular to the plane of the substrate, the support pillar structure at least partially overlaps with the repair driving circuit.

* * * * *